US009693467B2

(12) United States Patent
Tanabe et al.

(10) Patent No.: US 9,693,467 B2
(45) Date of Patent: Jun. 27, 2017

(54) PRODUCING METHOD OF SUSPENSION BOARD WITH CIRCUIT

(71) Applicant: NITTO DENKO CORPORATION, Osaka (JP)

(72) Inventors: Hiroyuki Tanabe, Osaka (JP); Hitoki Kanagawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 407 days.

(21) Appl. No.: 14/558,070

(22) Filed: Dec. 2, 2014

(65) Prior Publication Data

US 2015/0156892 A1 Jun. 4, 2015

(30) Foreign Application Priority Data

Dec. 4, 2013 (JP) ................................ 2013-251160

(51) Int. Cl.

| | |
|---|---|
| ***H05K 3/46*** | (2006.01) |
| ***C25D 5/02*** | (2006.01) |
| ***G11B 5/48*** | (2006.01) |
| ***H05K 3/44*** | (2006.01) |
| *H05K 1/05* | (2006.01) |

(52) U.S. Cl.

CPC ............ *H05K 3/4661* (2013.01); *C25D 5/02* (2013.01); *G11B 5/4873* (2013.01); *H05K 3/44* (2013.01); *H05K 1/056* (2013.01)

(58) Field of Classification Search

None

See application file for complete search history.

(56) References Cited

U.S. PATENT DOCUMENTS

| | | | | |
|---|---|---|---|---|
| 6,030,877 | A * | 2/2000 | Lee | H01L 27/08 257/295 |
| 6,083,842 | A * | 7/2000 | Cheung | H01L 21/76843 257/E21.584 |
| 6,428,658 | B1 * | 8/2002 | Asano | G11B 5/484 204/192.13 |
| 7,006,330 | B1 * | 2/2006 | Subrahmanyam | G11B 5/4826 360/234.5 |
| 9,241,410 | B2 * | 1/2016 | Ishigaki | H05K 1/189 |

(Continued)

FOREIGN PATENT DOCUMENTS

| | | | |
|---|---|---|---|
| JP | 2008177261 | A * | 7/2008 |
| JP | 2013-062012 | A | 4/2013 |

*Primary Examiner* — Harry D Wilkins, III

(74) *Attorney, Agent, or Firm* — Edwards Neils LLC; Jean C. Edwards, Esq.

(57) ABSTRACT

A method for producing a suspension board with circuit includes the steps of (7) removing a first electroless plating layer corresponding to a first terminal and/or a second electroless plating layer corresponding to a second terminal by etching, (8) removing a metal supporting board in contact with the lower surface of a first conductive layer filling the inside of a first opening portion, and (9) providing an electrolytic plating layer on the surface of the first terminal with the first electroless plating layer removed and/or the surface of the second terminal with the second electroless plating layer removed and the lower surface of the first conductive layer exposed from the inside of the first opening portion by electrolytic plating supplying electricity from the metal supporting board.

7 Claims, 24 Drawing Sheets

(56) References Cited

U.S. PATENT DOCUMENTS

| | | | | | |
|---|---|---|---|---|---|
| 2002/0054460 | A1* | 5/2002 | Takahashi | G11B 5/313 | 360/123.39 |
| 2003/0022477 | A1* | 1/2003 | Hsieh | H01L 21/4853 | 438/612 |
| 2007/0209829 | A1* | 9/2007 | Ishii | H05K 1/0259 | 174/255 |
| 2008/0142982 | A1* | 6/2008 | Zhang | H01L 23/53238 | 257/762 |
| 2010/0118443 | A1* | 5/2010 | Ohsawa | G11B 5/4853 | 360/245.8 |
| 2011/0189848 | A1* | 8/2011 | Ewert | C25D 3/32 | 438/612 |
| 2011/0303440 | A1* | 12/2011 | Lim | H05K 1/0203 | 174/255 |
| 2013/0020112 | A1 | 1/2013 | Ohsawa | | |
| 2013/0033785 | A1* | 2/2013 | Feng | G11B 5/4853 | 360/234.5 |
| 2013/0133939 | A1* | 5/2013 | Ishii | H05K 1/115 | 174/262 |
| 2015/0156892 | A1* | 6/2015 | Tanabe | H05K 3/4661 | 205/125 |

* cited by examiner

PRODUCING METHOD OF SUSPENSION BOARD WITH CIRCUIT

CROSS-REFERENCE TO RELATED APPLICATION

The present application claims priority from Japanese Patent Application No. 2013-251160 filed on Dec. 4, 2013, the contents of which are hereby incorporated by reference into this application.

BACKGROUND OF THE INVENTION

Field of the Invention

The present invention relates to a method for producing a suspension board with circuit, to be specific, to a method for producing a suspension board with circuit used in a hard disk drive.

Description of Related Art

In order to improve a degree of freedom in the design of a conductive layer, a suspension board with circuit in which a first base insulating layer, a first conductive layer, a second base insulating layer, and a second conductive layer are sequentially laminated on a metal supporting board has been known. In the suspension board with circuit, for example, while an element-side terminal included in the first conductive layer is electrically connected to a piezo element, a head-side terminal included in the second conductive layer is electrically connected to a magnetic head, and then, the suspension board with circuit is used in a hard disk drive.

It has been proposed that a method for producing the suspension board with circuit includes the following steps (ref: for example, Japanese Unexamined Patent Publication No. 2013-62012):

(1) a step of forming a first base insulating layer having a first opening portion on a metal supporting board, (2) a step of forming a first conductive layer including a first terminal and a first wire on the first base insulating layer so as to fill the inside of the first opening portion, (3) a step of forming a second base insulating layer on the first base insulating layer so as to have a second opening portion that exposes a part of the first wire and to cover the remaining first wire, and (4) a step of forming a second conductive layer including a second terminal and a second wire on the second base insulating layer so as to fill the inside of the second opening portion.

SUMMARY OF THE INVENTION

In order to protect the first wire and/or the second wire, for example, it has been considered that after forming a first conductive layer and/or a second conductive layer, an electroless plating layer that is made of, for example, nickel is formed on the surface(s) of the first conductive layer and/or the second conductive layer by electroless plating.

In order to surely perform the electroless plating, a long plating time is required to be ensured. In such a case, there may be a case where a plating layer is (plating particles are) also formed on the surface of the metal supporting board. In this case, it is required that the plating particles are removed by etching or the like. In this case, the above-described etching time is required to be set long and then, there is a disadvantage that the first terminal and/or the second terminal are/is over-etched. Thus, there is a disadvantage that the connection reliability of the first terminal and/or the second terminal is reduced.

On the other hand, there is a demand that the surface(s) of the first terminal and/or the second terminal are/is protected by an electrolytic plating layer made of gold or the like by electrolytic plating. In order to do that, it may take much labor because a plating lead that is continuous to the first conductive layer and/or the second conductive layer is required to be separately formed.

It is an object of the present invention to provide a method for producing a suspension board with circuit in which a first conductive layer and/or a second conductive layer are/is capable of being protected by an electroless plating layer by performing stable electroless plating; a first terminal and/or a second terminal are/is capable of being protected by an electrolytic plating layer by easily performing electrolytic plating; and furthermore, a degree of freedom in the design of the first conductive layer and the second conductive layer is improved.

A method for producing a suspension board with circuit of the present invention includes the steps of (1) providing a first insulating layer on a metal supporting board so as to provide a first opening portion and a second opening portion penetrating in a thickness direction of the first insulating layer, (2) providing a first conductive layer including a first terminal on the first insulating layer so as to fill the inside of the first opening portion, (3) providing a first electroless plating layer on the surface of the first conductive layer by electroless plating, (4) providing a second insulating layer on the first insulating layer so as to provide a third opening portion penetrating in the thickness direction of the second insulating layer and exposing the first electroless plating layer and also forming the third opening portion so as to expose a part of the first electroless plating layer provided on the surface of the first conductive layer, (5) providing a second conductive layer including a second terminal on the second insulating layer so as to fill the inside of the third opening portion or on the second insulating layer and the first insulating layer so as to fill the second opening portion and the third opening portion, (6) providing a second electroless plating layer on the surface of the second conductive layer by electroless plating, (7) removing the first electroless plating layer corresponding to the first terminal and/or the second electroless plating layer corresponding to the second terminal by etching, (8) removing the metal supporting board in contact with the lower surface of the first conductive layer filling the inside of the first opening portion, and (9) providing an electrolytic plating layer on the surface of the first terminal with the first electroless plating layer removed and/or the surface of the second terminal with the second electroless plating layer removed and the lower surface of the first conductive layer exposed from the inside of the first opening portion by electrolytic plating supplying electricity from the metal supporting board.

According to this method, (2) the first conductive layer including the first terminal is provided on the first insulating layer so as to fill the inside of the first opening portion, so that the first conductive layer is capable of being electrically connected to the metal supporting board via the first opening portion.

Also, (5) the second conductive layer including the second terminal is provided on the second insulating layer so as to fill the inside of the third opening portion or on the second insulating layer and the first insulating layer so as to fill the second opening portion and the third opening portion, so that the second conductive layer is capable of being electrically connected to the metal supporting board via the third opening portion and the first opening portion or the second opening portion.

Thus, by etching for a relatively short time, a plating material for constituting the first electroless plating layer corresponding to the first terminal, the second electroless plating layer corresponding to the second terminal, and furthermore, the electroless plating layer depositing on the metal supporting board is capable of being surely removed.

As a result, over-etching of the first terminal and/or the second terminal is capable of being prevented, so that a reduction in the connection reliability of the first terminal and/or the second terminal is capable of being prevented.

According to this method, (9) the electrolytic plating layer is provided on the surface of the first terminal from which the first electroless plating layer is removed and/or the surface of the second terminal from which the second electroless plating layer is removed and the lower surface of the first conductive layer that is exposed from the inside of the first opening portion by electrolytic plating that supplies electricity from the metal supporting board, so that the electrolytic plating layer is capable of being provided on the surface of the first terminal from which the first electroless plating layer is removed and/or the surface of the second terminal from which the second electroless plating layer is removed and the lower surface of the first conductive layer that is exposed from the inside of the first opening portion to be protected without separately providing a plating lead.

Additionally, in the suspension board with circuit obtained by this method, each of the first conductive layer and the second conductive layer is provided in each of the first insulating layer and the second insulating layer, so that a degree of freedom in the design of the first conductive layer and the second conductive layer is capable of being improved.

In the method for producing a suspension board with circuit of the present invention, it is preferable that (4) in the step of forming the second insulating layer, a fourth opening portion is formed in the second insulating layer so as to communicate with the second opening portion and (5) in the step of providing the second conductive layer, the second conductive layer is provided on the second insulating layer so as to fill the inside of the second opening portion, the third opening portion, and the fourth opening portion.

According to this method, (4) in the step of forming the second insulating layer, the fourth opening portion is formed in the second insulating layer so as to communicate with the second opening portion and (5) in the step of providing the second conductive layer, the second conductive layer is provided on the second insulating layer so as to fill the inside of the second opening portion, the third opening portion, and the fourth opening portion, so that the second conductive layer is capable of being electrically connected to the metal supporting board via the second opening portion and the fourth opening portion.

Thus, the electrolytic plating layer is capable of being further more surely provided on the surface of the second terminal, furthermore, the surface of the first terminal, and the lower surface of the first conductive layer that is exposed from the inside of the first opening portion by electrolytic plating that supplies electricity from the metal supporting board.

In the method for producing a suspension board with circuit of the present invention, it is preferable that (10) a step of insulating the metal supporting board in contact with the lower surface of the second conductive layer filling the inside of the second opening portion from the surrounding metal supporting board is further included.

According to this method, the metal supporting board in contact with the lower surface of the second conductive layer filling the inside of the second opening portion is insulated from the surrounding metal supporting board, so that the second conductive layer is capable of being used for various uses.

In the method for producing a suspension board with circuit of the present invention, it is preferable that (4) in the step of providing the second insulating layer, the third opening portion is, when projected in the thickness direction, formed so as to be disposed at the same position as that of the first opening portion.

According to this method, in the step of providing the second insulating layer, the third opening portion is, when projected in the thickness direction, disposed at the same position as that of the first opening portion, so that space saving of the first opening portion and the third opening portion is capable of being achieved.

In the method for producing a suspension board with circuit of the present invention, it is preferable that (4) in the step of providing the second insulating layer, the third opening portion is, when projected in the thickness direction, formed so as to be disposed at a position different from that of the first opening portion.

According to this method, (4) in the step of providing the second insulating layer, the third opening portion is, when projected in the thickness direction, disposed at a position different from that of the first opening portion, so that a degree of freedom in the design of the first opening portion and the third opening portion is capable of being improved.

In the method for producing a suspension board with circuit of the present invention, it is preferable that the metal supporting board is disposed along a longitudinal direction; (1) in the step of providing the first insulating layer, a plurality of the first opening portions are provided; and (8) in the step of removing the metal supporting board in contact with the lower surface of the first conductive layer filling the inside of the first opening portion, the metal supporting board in contact with the lower surface of the first conductive layer filling the inside of the first opening portion is removed so that a plurality of support opening portions penetrating in the thickness direction are provided and a plurality of the support opening portions are symmetrically disposed with respect to a reference line along the longitudinal direction.

According to this method, a plurality of the support opening portions are symmetrically disposed with respect to the reference line along the longitudinal direction, so that a balance of both sides of the reference line in the obtained suspension board with circuit is capable of being further more improved.

In the method for producing a suspension board with circuit of the present invention, it is preferable that the metal supporting board is made of stainless steel and the first electroless plating layer and/or the second electroless plating layer are/is formed of nickel.

In this method, although nickel particles made of nickel for constituting the first electroless plating layer and/or the second electroless plating layer are easily attached to the metal supporting board made of stainless steel, the present invention includes the above-described structure, so that the above-described attachment is capable of being effectively suppressed.

According to the present invention, over-etching of the first terminal and/or the second terminal is capable of being prevented, so that a reduction in the connection reliability of the first terminal and/or the second terminal is capable of being prevented and a degree of freedom in the design of the first conductive layer and the second conductive layer is capable of being improved.

BRIEF DESCRIPTION OF THE DRAWINGS

FIG. 22A illustrating a step of providing a second base insulating layer,

FIG. 22B illustrating a step of providing a second conductive layer, and

FIG. 22C illustrating a step of providing a second electroless plating layer.

FIG. 23D illustrating a step of providing a cover insulating layer,

FIG. 23E illustrating a step of removing a second electroless plating layer provided in external-side terminals and slider-side terminals, and FIG. 23F illustrating a step of removing a metal supporting board in contact with the lower surface of a first conductive layer filling the inside of a first base opening portion.

FIG. 24G illustrating a step of removing a first base insulating layer so as to expose the lower surface of a light emitting-side terminal, FIG. 24H illustrating a step of providing an electrolytic plating layer, and FIG. 24I illustrating a step of insulating a metal supporting board in contact with the lower surface of a second conductive layer filling the inside of a second base opening portion from the surrounding metal supporting board.

DETAILED DESCRIPTION OF THE INVENTION

[Structure of Embodiment]

Figure 1:
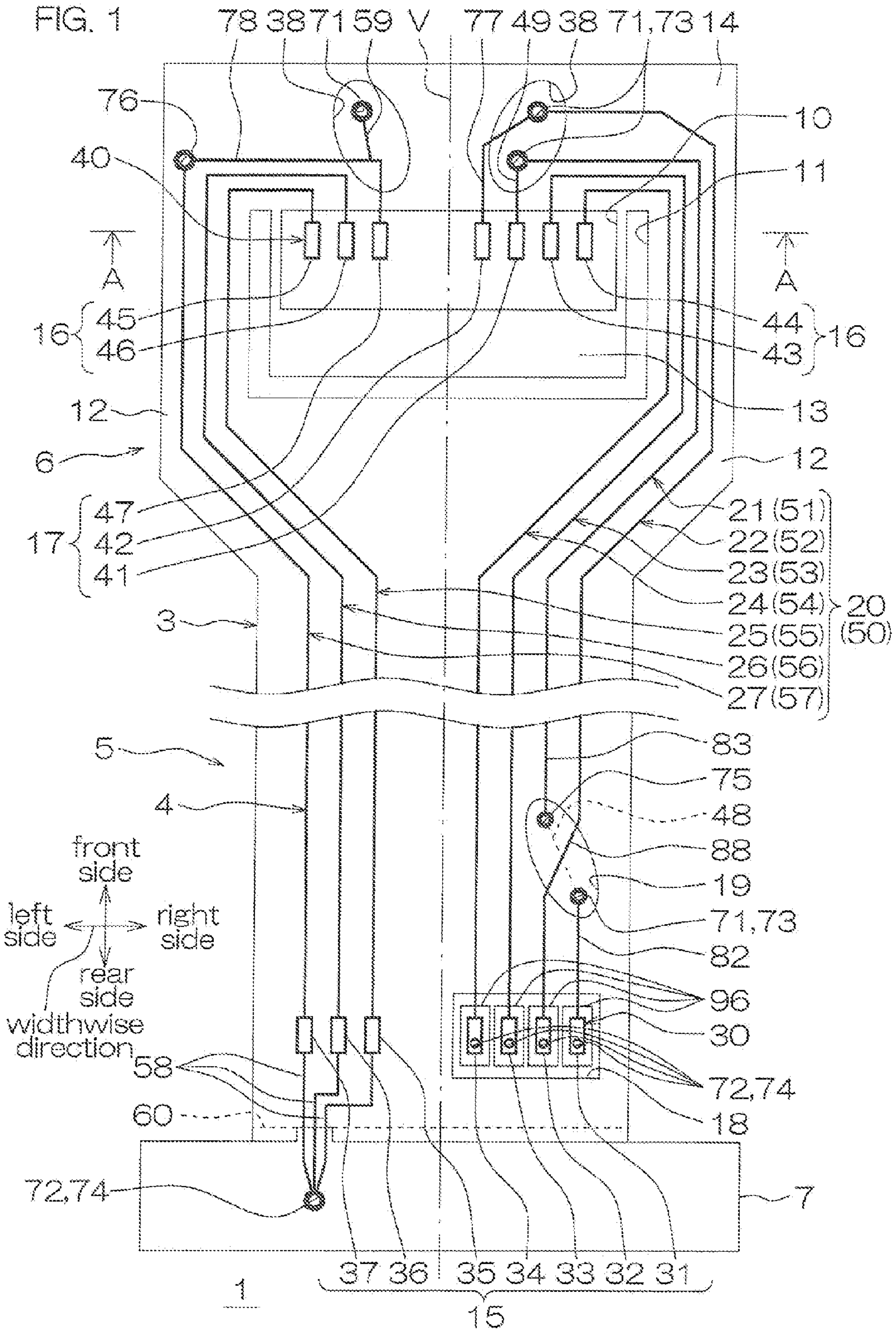
FIG. 1 shows a plan view of a suspension board with circuit produced by one embodiment of a method for producing a suspension board with circuit of the present invention.

In FIG. 1, the upper side of the paper surface is referred to as a front side (one side in a first direction); the lower side of the paper surface is referred to as a rear side (the other side in the first direction); the left side of the paper surface is referred to as a left side (one side in a second direction perpendicular to the first direction, one side in a widthwise direction); the right side of the paper surface is referred to as a right side (the other side in the second direction, the other side in the widthwise direction); the near side in the paper thickness direction of the paper surface is referred to as an upper side (one side in a third direction perpendicular to the first direction and the second direction, one side in a thickness direction); and the far side in the paper thickness direction of the paper surface is referred to as a lower side (the other side in the third direction, the other side in the thickness direction). Directions in figures subsequent to FIG. 2 are also in conformity with the directions in FIG. 1.

Figure 2:
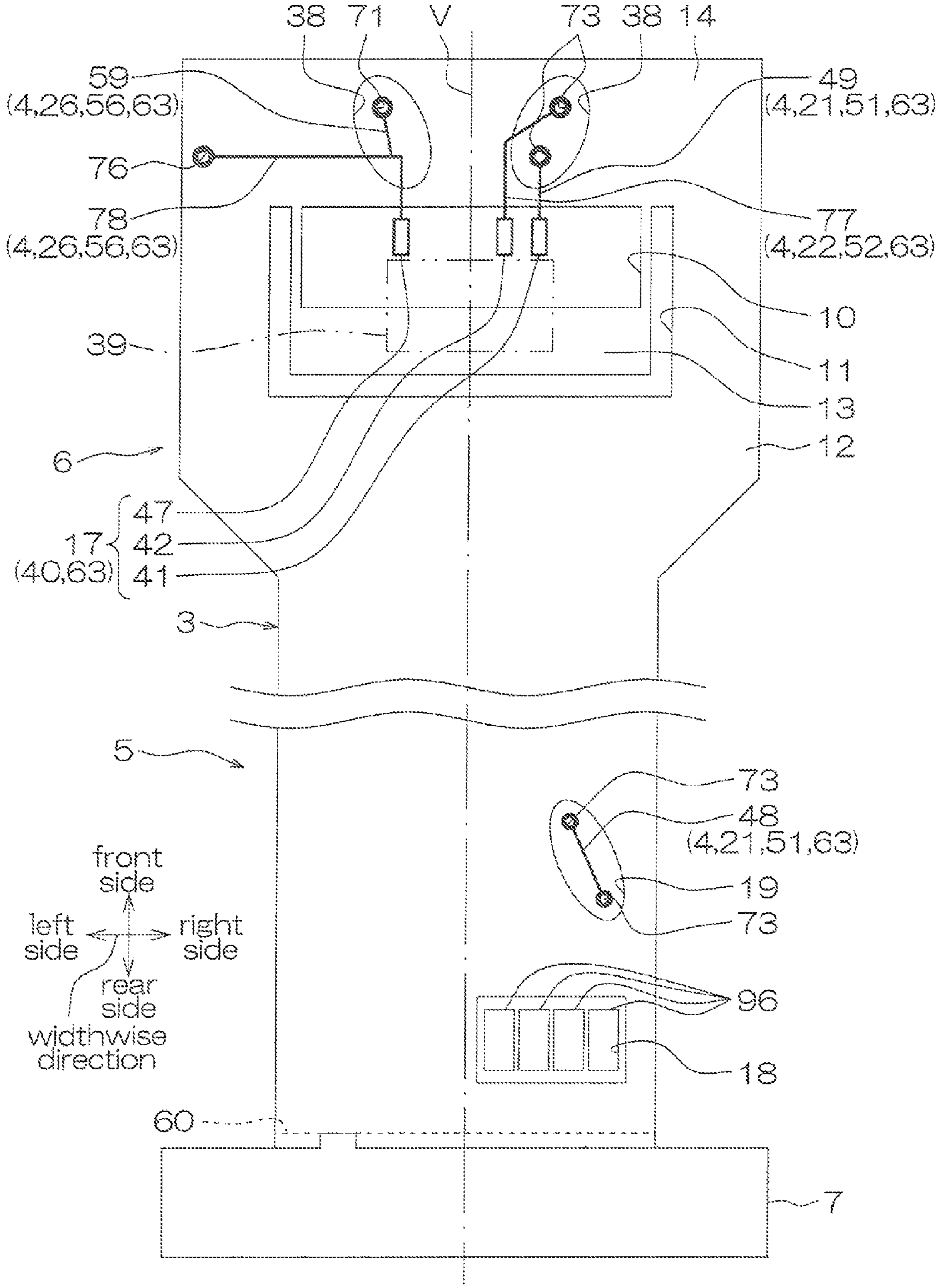
FIG. 2 shows a plan view of the suspension board with circuit shown in FIG. 1 illustrating a metal supporting board and a first conductive layer of conductive layers.
Figure 3:
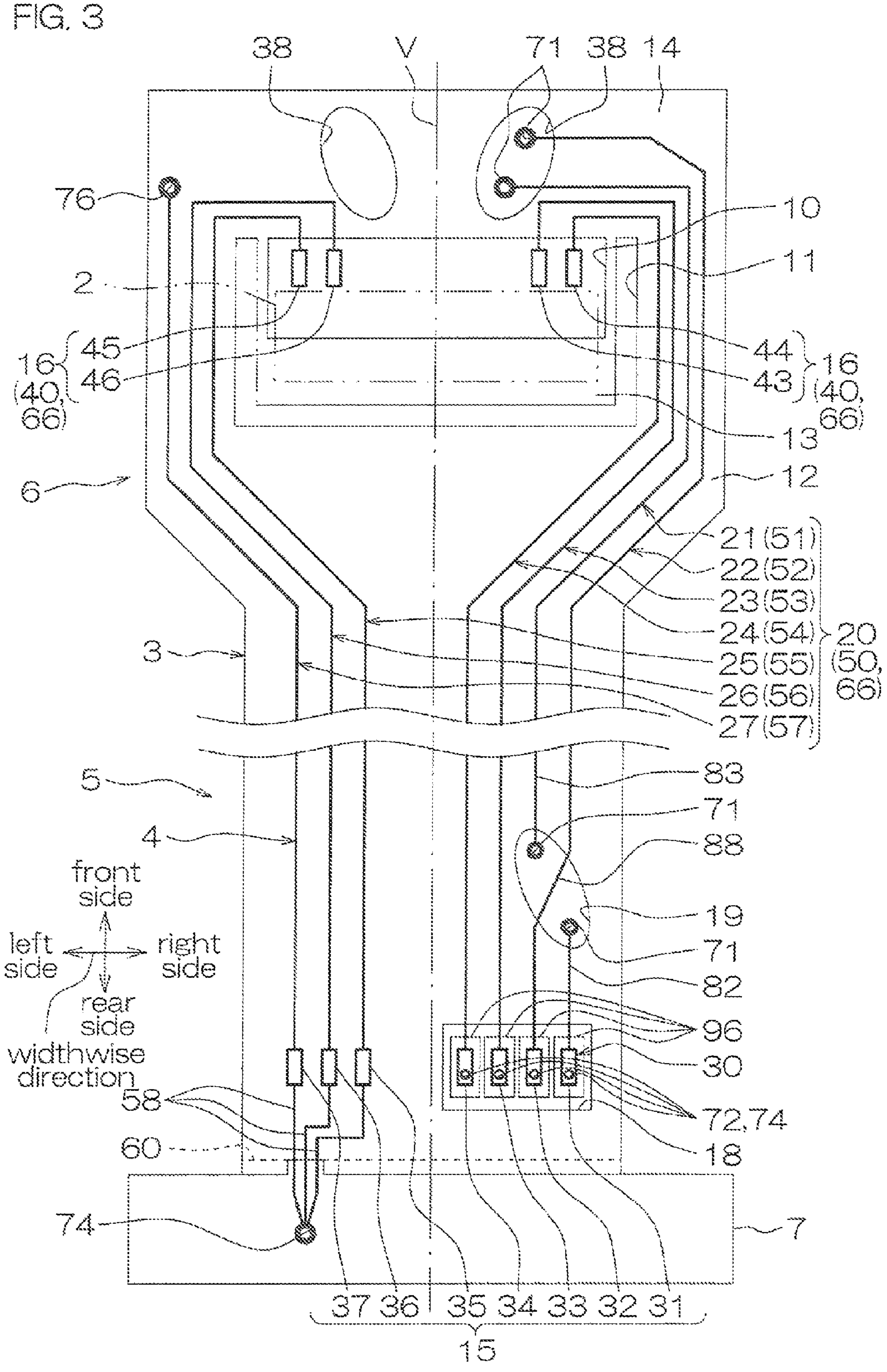
FIG. 3 shows a plan view of the suspension board with circuit shown in FIG. 1 illustrating a metal supporting board and a second conductive layer of conductive layers.

In FIGS. 1 to 3, a first base insulating layer 62, a second base insulating layer 65, a cover insulating layer 68, a first electroless plating layer 64, and a second electroless plating layer 67 to be described later are omitted so as to clearly show the relative arrangement of a metal supporting board 3 and a conductive layer 4 to be described later. In FIG. 2, of the conductive layers 4, a first conductive layer 63 to be described later is shown and in FIG. 3, of the conductive layers 4, a second conductive layer 66 to be described later is shown.

<Summary of Suspension Board with Circuit 1>

In FIG. 1, a suspension board with circuit 1 is mounted with a slider 2 (a phantom line in FIG. 3), which is mounted with a magnetic head (not shown), and a light emitting element 39 (a phantom line in FIG. 2). Then, the suspension board with circuit 1 is mounted on a hard disk drive (not shown). In the suspension board with circuit 1, the conductive layer 4 is supported by the metal supporting board 3. The metal supporting board 3 is formed into a generally rectangular flat belt shape in plane view extending in a front-rear direction. The outer shape of the metal supporting board 3 forms a symmetrical shape with respect to a reference line V that passes through the center in the widthwise direction of the metal supporting board 3 along the front-rear direction. The metal supporting board 3 integrally includes a main body portion 5 and a gimbal portion 6 that is provided at the front side of the main body portion 5.

The main body portion 5 is formed into a generally rectangular shape in plane view extending in the front-rear direction. The rear end portion of the main body portion 5 is connected to a frame 7 that is formed of the same layer (plate) as that of the metal supporting board 3. The frame 7 is formed into a generally rectangular shape in plane view extending in the right-left direction. In the main body portion 5, as a support opening portion that penetrates in the thickness direction of the metal supporting board 3, a first support opening portion 18 and as a support opening portion, a second support opening portion 19 are provided.

The first support opening portion 18 is provided at the right-side portion of the rear end portion of the main body portion 5. To be specific, the first support opening portion 18 is, in plane view, formed into a generally rectangular shape extending long in the widthwise direction and including a first rear-side terminal 31, a second rear-side terminal 32, a third rear-side terminal 33, and a fourth rear-side terminal 34 (described later). A plurality of terminal support portions 96 are provided in the first support opening portion 18.

Each of a plurality of the terminal support portions 96 is provided corresponding to each of the first rear-side terminal 31, the second rear-side terminal 32, the third rear-side terminal 33, and the fourth rear-side terminal 34. A plurality of the terminal support portions 96 are provided at spaced intervals to the inner side of the circumference side surface of the first support opening portion 18. A plurality of the terminal support portions 96 are disposed at spaced intervals to each other in the widthwise direction. Each of a plurality of the terminal support portions 96 is formed into a generally rectangular shape in plane view extending in the front-rear direction.

The second support opening portion 19 is provided at the right-side portion midway in the front-rear direction of the main body portion 5. To be specific, the second support opening portion 19 includes a first crossing portion 48 (described later) and is formed into a generally elliptical shape in plane view having a long axis that gradually inclines to the left side in the widthwise direction toward the front side.

The gimbal portion 6 is provided continuously from the front end edge of the main body portion 5 toward the front side and is formed into a generally rectangular shape in plane view expanding toward the both sides in the widthwise direction with respect to the main body portion 5. At the central portion of the gimbal portion 6, a slit 11 in a generally U-shape in plane view penetrating in the thickness direction of the metal supporting board 3 and having an opening toward the front side is provided. The slit 11 is formed into a line symmetrical shape with respect to the reference line V. The gimbal portion 6 includes outrigger portions 12, each of which is provided at each of the outer sides in the widthwise direction of the slit 11, a tongue portion 13 that is sandwiched between the inner sides in the widthwise direction of the slit 11, and a folded-back portion 14 that is disposed at the front side of the outrigger portions 12 and the tongue portion 13.

Each of the outrigger portions 12 is provided at both sides in the widthwise direction of the gimbal portion 6. Each of one pair of the outrigger portions 12 is formed into a generally rectangular shape in plane view extending in a longitudinal direction.

Figure 4:
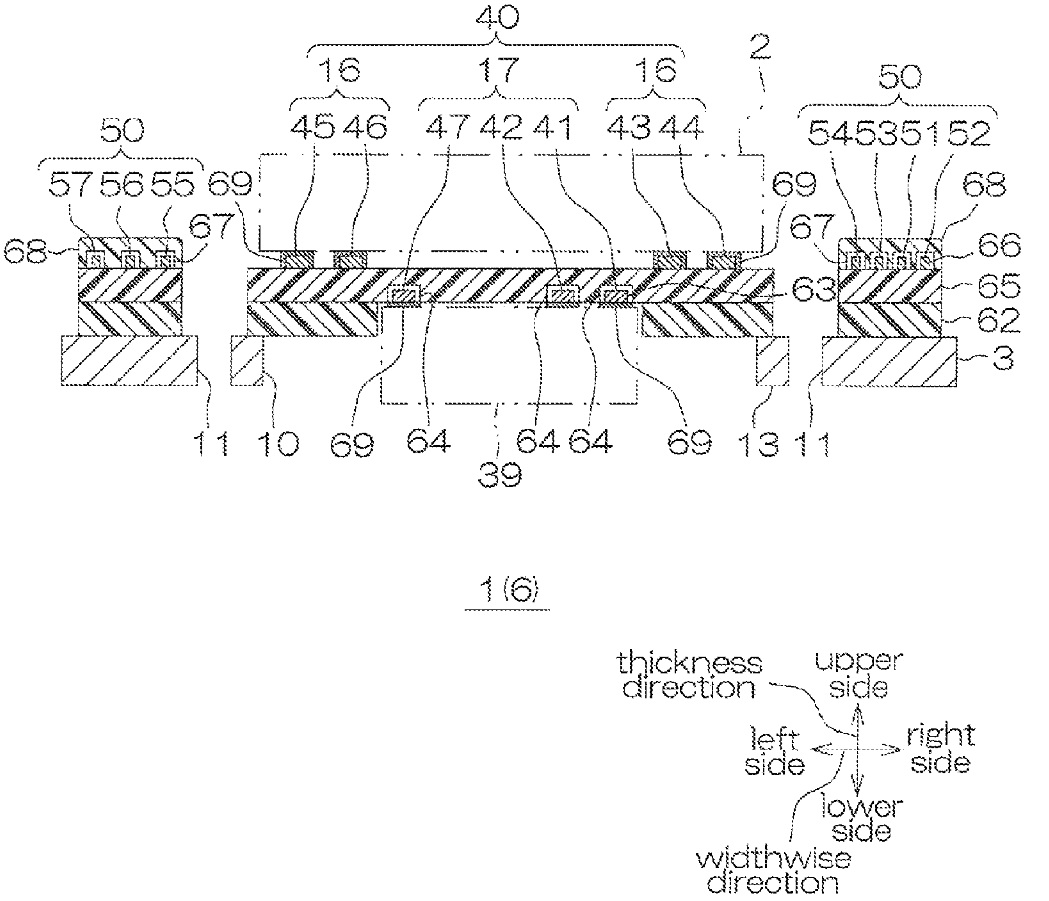
FIG. 4 shows a front sectional view along an A-A line of the suspension board with circuit in FIG. 1.

The tongue portion 13 is formed into a shape extending in a generally rectangular tongue shape in plane view from the folded-back portion 14 toward the rear side. As shown in FIG. 4, the slider 2 (ref: the phantom line) is mounted at the upper side of the tongue portion 13 and the light emitting element 39 (ref: the phantom line) is mounted at the lower side of the tongue portion 13. As shown in FIG. 1, a terminal opening portion 10 that penetrates in the thickness direction of the metal supporting board 3 is provided at the front-side portion of the tongue portion 13.

The terminal opening portion 10 surrounds a plurality of front-side terminals 40 (described later) and is formed into a generally rectangular shape in plane view extending in a right-left direction. The terminal opening portion 10 is disposed at spaced intervals to the inner side in the right-left direction of the slit 11. The terminal opening portion 10 is formed into a linear symmetrical shape with respect to the reference line V.

The folded-back portion 14 is formed into a generally rectangular shape in plane view extending in the widthwise direction. In the folded-back portion 14, as support opening portions, one pair of third support opening portions 38 are provided. The one pair of the third support opening portions 38 penetrate in the thickness direction of the metal supporting board 3 and form symmetrical shapes with respect to the reference line V. Each of the one pair of the third support opening portions 38 is formed into a generally elliptical shape in plane view having a long axis that gradually inclines to the outer side in the widthwise direction toward the front side.

The conductive layer 4 includes a plurality of conductive patterns 20 that are provided in the front-rear direction of the suspension board with circuit 1. To be specific, the conductive layer 4 includes a first conductive pattern 21, a second conductive pattern 22, a third conductive pattern 23, a fourth conductive pattern 24, a fifth conductive pattern 25, a sixth conductive pattern 26, and a seventh conductive pattern 27. Each of a plurality of the conductive patterns 20 includes, as second terminals, a plurality of rear-side terminals 30 that are provided in the main body portion 5; a plurality of the front-side terminals 40 that are provided in the gimbal portion 6; and a plurality of wires 50 that connect each of a plurality of the front-side terminals 40 to each of a plurality of the rear-side terminals 30.

A plurality of the rear-side terminals 30 are provided in the rear end portion of the main body portion 5 and are disposed at spaced intervals to each other in the widthwise direction. Each of a plurality of the rear-side terminals 30 is formed into a generally rectangular shape in plane view extending in the front-rear direction. A plurality of the rear-side terminals 30 include the first rear-side terminal 31 included in the first conductive pattern 21, the second rear-side terminal 32 included in the second conductive pattern 22, the third rear-side terminal 33 included in the third conductive pattern 23, the fourth rear-side terminal 34 included in the fourth conductive pattern 24, a fifth rear-side terminal 35 included in the fifth conductive pattern 25, a sixth rear-side terminal 36 included in the sixth conductive pattern 26, and a seventh rear-side terminal 37 included in the seventh conductive pattern 27. The first rear-side terminal 31, the second rear-side terminal 32, the third rear-side terminal 33, the fourth rear-side terminal 34, the fifth rear-side terminal 35, the sixth rear-side terminal 36, and the seventh rear-side terminal 37 are sequentially disposed from the right side toward the left side. To be specific, the third rear-side terminal 33 to the sixth rear-side terminal 36 are external terminals to be electrically connected to an external circuit board (not shown) such as a read/write board. On the other hand, the first rear-side terminal 31, the second rear-side terminal 32, and the seventh rear-side terminal 37 are terminals for a power source to be electrically connected to a power source 29. The first rear-side terminal 31 to the fourth rear-side terminal 34 are disposed at a half portion of the right side with respect to the reference line V in the rear end portion of the main body portion 5. To be more specific, the first rear-side terminal 31 to the fourth rear-side terminal 34 are, in plane view, disposed so as to be included in the first support opening portion 18. The fifth rear-side terminal 35 to the seventh rear-side terminal 37 are disposed at a half portion of the left side with respect to the reference line V in the rear end portion of the main body portion 5.

A plurality of the front-side terminals 40 are, at the inside of the terminal opening portion 10, disposed at spaced intervals to each other in the widthwise direction. Each of a plurality of the front-side terminals 40 is formed into a generally rectangular shape in plane view extending in the front-rear direction. As shown in FIG. 4, though described later, a plurality of the front-side terminals 40 are supported by the second base insulating layer 65. As shown in FIG. 1, a plurality of the front-side terminals 40 include a first front-side terminal 41 included in the first conductive pattern 21, a second front-side terminal 42 included in the second conductive pattern 22, a third front-side terminal 43 included in the third conductive pattern 23, a fourth front-side terminal 44 included in the fourth conductive pattern 24, a fifth front-side terminal 45 included in the fifth conductive pattern 25, a sixth front-side terminal 46 included in the sixth conductive pattern 26, and a seventh front-side terminal 47 included in the seventh conductive pattern 27. The fourth front-side terminal 44, the third front-side terminal 43, the first front-side terminal 41, the second front-side terminal 42, the seventh front-side terminal 47, the sixth front-side terminal 46, and the fifth front-side terminal 45 are sequentially disposed from the right side toward the left side. Of a plurality of the front-side terminals 40, the front-side terminals 40 that are disposed at the outer side in the widthwise direction, to be specific, the third front-side terminal 43 to the sixth front-side terminal 46 are slider-side terminals 16 that are electrically connected to the slider 2 (ref: the phantom line in FIG. 3). On the other hand, of a plurality of the front-side terminals 40, the front-side terminals 40 that are disposed at the inner side in the widthwise direction of the slider-side terminals 16, to be specific, the first front-side terminal 41, the second front-side terminal 42, and the seventh front-side terminal 47 are, as first terminals, light emitting-side terminals 17 that are electrically connected to the light emitting element 39 (ref: the phantom line in FIG. 2). The first front-side terminal 41 to the fourth front-side terminal 44 are disposed at a half portion of the right side of the gimbal portion 6, to be specific, are disposed at a half portion of the right side with respect to the reference line V in the terminal opening portion 10. The fifth front-side terminal 45 to the seventh front-side terminal 47 are disposed at a half portion of the left side of the gimbal portion 6, to be specific, are disposed at a half portion of the left side with respect to the reference line V in the terminal opening portion 10.

A plurality of the wires 50 are disposed over the main body portion 5 and the gimbal portion 6. A plurality of the wires 50 include a first wire 51 included in the first conductive pattern 21, a second wire 52 included in the second conductive pattern 22, a third wire 53 included in the third conductive pattern 23, a fourth wire 54 included in the fourth conductive pattern 24, a fifth wire 55 included in the fifth conductive pattern 25, a sixth wire 56 included in the sixth conductive pattern 26, and a seventh wire 57 included in the seventh conductive pattern 27. Of a plurality of the wires 50, the outer-side wires that are disposed at the outer side in the widthwise direction in the main body portion 5, that is, the first wire 51, the second wire 52, and the seventh wire 57 are power wires that carry an electric current supplied from the power source 29 to the light emitting element 39. On the other hand, of a plurality of the wires 50, the inner-side wires that are disposed at the inner side of the power wires in the main body portion 5, that is, the third wire 53 to the sixth wire 56 are differential wires that transmit a differential signal (a read signal and/or a write signal).

The first wire 51 to the fourth wire 54 are disposed at a half portion of the right side with respect to the reference line V in the metal supporting board 3. To be specific, each of the first wire 51 to the fourth wire 54 is, in the main body portion 5, disposed so as to extend from each of the front ends of the first rear-side terminal 31 to the fourth rear-side terminal 34 toward the front side. Each of the first wire 51 to the fourth wire 54 is disposed so as to bend to reach the outrigger portion 12 at the right side, extend toward the front side so as to pass through the outrigger portion 12 at the right side, bend to the left side in the folded-back portion 14, subsequently bend toward the rear side, reach the terminal opening portion 10 in the tongue portion 13, and subsequently, reach each of the front ends of the first front-side terminal 41 to the fourth front-side terminal 44. Although described in detail later, the first wire 51 and the second wire 52 are disposed so as to cross each other midway in the front-rear direction of the main body portion 5, when projected in the thickness direction. The third wire 53 and the fourth wire 54 are disposed at spaced intervals to each other. Furthermore, the first wire 51 and the third wire 53 are disposed at spaced intervals to each other and the second wire 52 and the third wire 53 are disposed at spaced intervals to each other.

The fifth wire 55 to the seventh wire 57 are disposed at a half portion of the left side with respect to the reference line V in the metal supporting board 3. To be specific, each of the fifth wire 55 to the seventh wire 57 is, in the main body portion 5, disposed so as to extend from each of the front ends of the fifth rear-side terminal 35 to the seventh rear-side terminal 37 toward the front side. Each of the fifth wire 55 to the seventh wire 57 is disposed so as to bend to reach the outrigger portion 12 at the left side, extend toward the front side so as to pass through the outrigger portion 12 at the left side, bend to the right side in the folded-back portion 14, subsequently bend toward the rear side, reach the terminal opening portion 10 in the tongue portion 13, and subsequently, reach each of the front ends of the fifth front-side terminal 45 to the seventh front-side terminal 47. The fifth wire 55 to the seventh wire 57 are disposed at spaced intervals to each other.

The conductive layer 4 includes auxiliary wires 58, each of which is connected to each of the fifth rear-side terminal 35 to the seventh rear-side terminal 37, and a branch wire 59 that branches off from the seventh wire 57.

The auxiliary wires 58 are, in the main body portion 5, disposed so as to extend from each of the rear end edges of the fifth rear-side terminal 35, the sixth rear-side terminal 36, and the seventh rear-side terminal 37 toward the rear side in a bundled state to reach the frame 7.

The branch wire 59 is, in the folded-back portion 14, formed into a linear shape that branches off from a midway of the seventh wire 57 (a third connecting portion 78 to be described later) extending in the widthwise direction, thereafter, extends toward the upper side, and reaches the third support opening portion 38 at the left side.

<Layered Structure of Suspension Board with Circuit>

As shown in FIG. 4, the suspension board with circuit 1 includes the metal supporting board 3, the first base insulating layer 62 as a first insulating layer, the first conductive layer 63, the first electroless plating layer 64, the second base insulating layer 65 as a second insulating layer, the second conductive layer 66, the second electroless plating layer 67, the cover insulating layer 68, and an electrolytic plating layer 69.

The metal supporting board 3 is formed corresponding to the outer shape of the suspension board with circuit 1. As shown in FIG. 1, the terminal opening portion 10, the slit 11, the first support opening portion 18, the second support opening portion 19, and the one pair of the third support opening portions 38 described above are provided in the metal supporting board 3. An example of a material that constitutes the metal supporting board 3 includes a metal material such as stainless steel, 42 alloy, aluminum, copper-beryllium, and phosphor bronze. Preferably, stainless steel is used. The metal supporting board 3 has a thickness of, for example, 5 μm or more, or preferably 10 μm or more, and of, for example, 60 μm or less, or preferably 25 μm or less. The first support opening portion 18, the second support opening portion 19, and each of the third support opening portions 38 have a maximum length of, for example, 0.01 mm or more, or preferably 0.03 mm or more, and of, for example, 100 mm or less, or preferably 1 mm or less.

Figure 5:
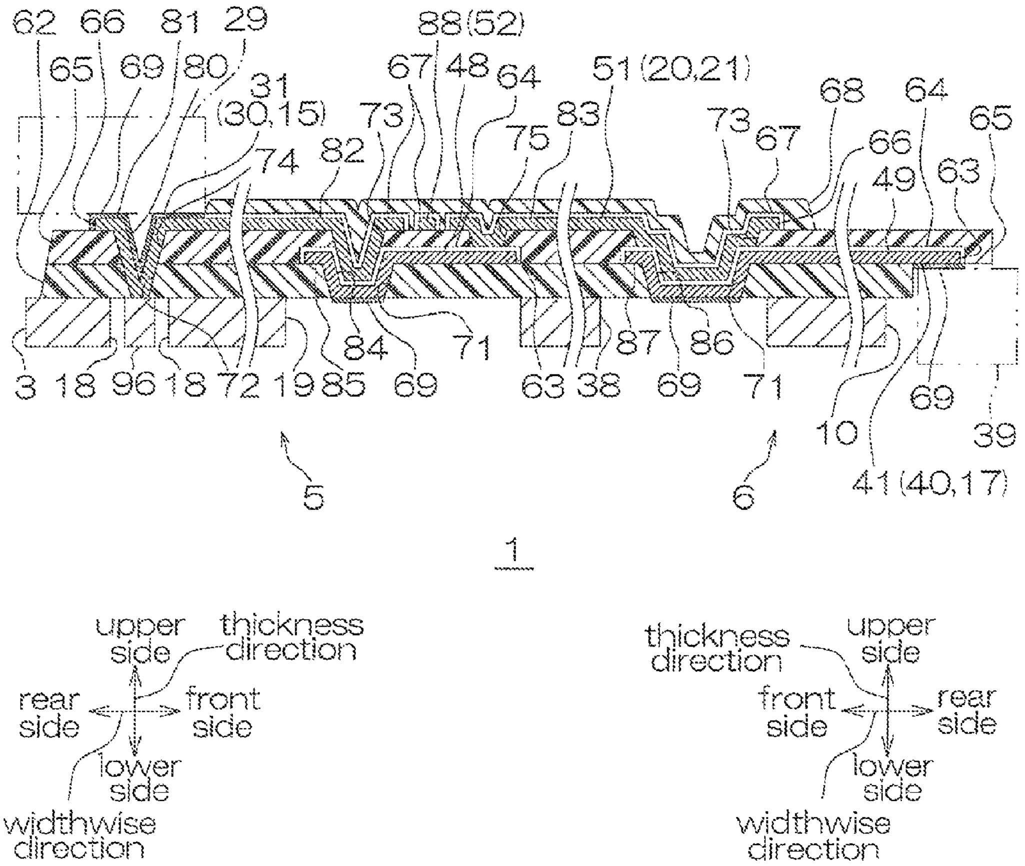
FIG. 5 shows a sectional view along a first conductive pattern of the suspension board with circuit in FIG. 1.
Figure 6:
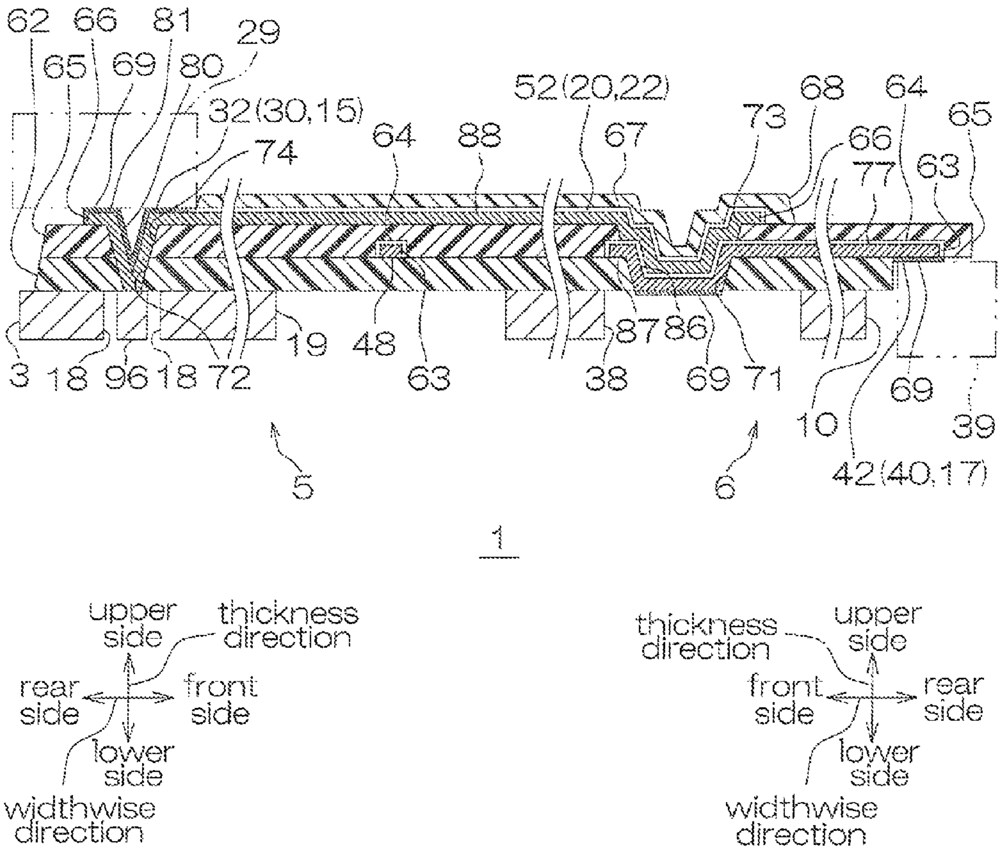
FIG. 6 shows a sectional view along a second conductive pattern of the suspension board with circuit in FIG. 1.
Figure 7:
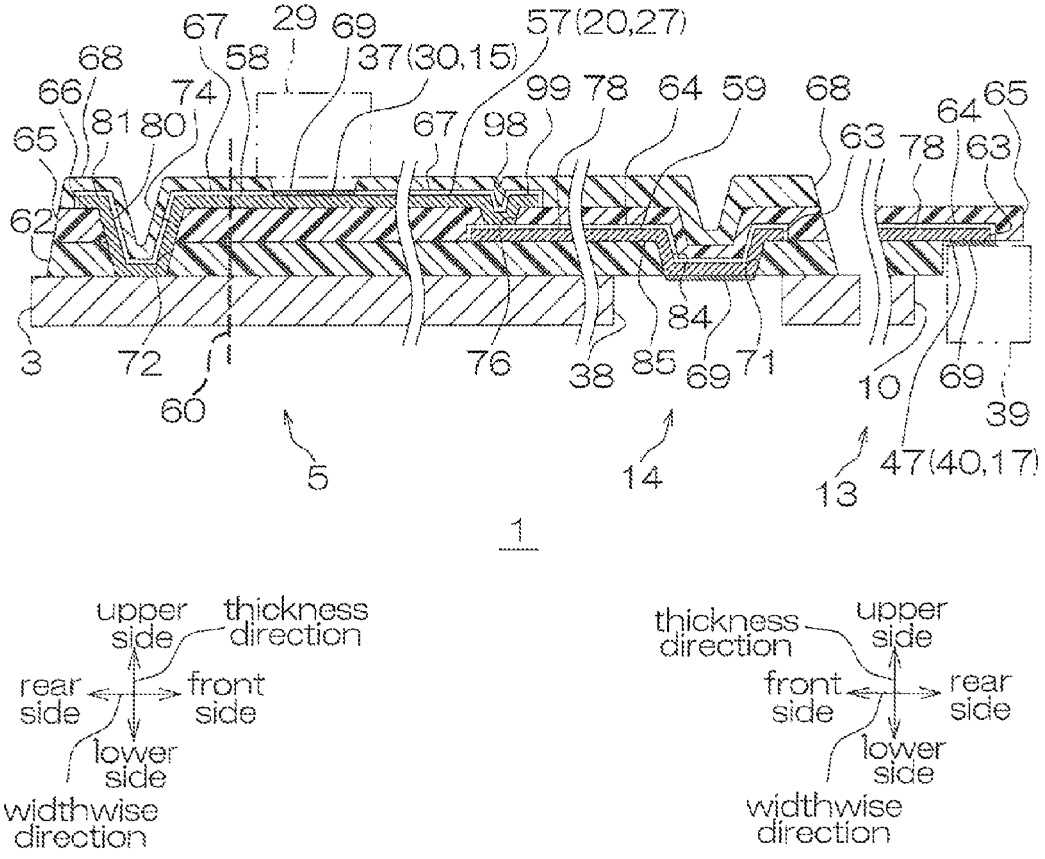
FIG. 7 shows a sectional view along a seventh conductive pattern of the suspension board with circuit in FIG. 1, and the right-most side portion shows a seventh front-side terminal and a left-hand portion thereof shows the right-side portion of one pair of third support opening portions.

As shown in FIGS. 4, 5, and 9A to 9D, the first base insulating layer 62 is disposed on the metal supporting board 3 and is provided so as to correspond to the first conductive layer 63 to be described next. To be specific, the first base insulating layer 62 is formed into a pattern of exposing the circumference end portion of the metal supporting board 3. As shown in FIGS. 5 to 7, the first base insulating layer 62 is, in the front-side portion of the terminal opening portion 10 in the tongue portion 13, formed into a pattern of exposing the light emitting-side terminal 17 (and the electrolytic plating layer 69 that corresponds thereto). That is, in the terminal opening potion 10, the rear end edge of the first base insulating layer 62 is disposed at the front side with respect to the rear end edge of the light emitting-side terminal 17. As referred in FIGS. 9A to 9D, in the first base insulating layer 62, as first opening portions, first base opening portions 71 and as second opening portions, second base opening portions 72 are provided.

As referred in FIG. 1, each of the first base opening portions 71 and the second base opening portions 72 is, for example, formed into a generally circular shape in plane view. A plurality of the first base opening portions 71 are provided corresponding to a plurality (one pair) of the third support opening portions 38 and a single piece of the second support opening portion 19. A plurality of the second base opening portions 72 are provided corresponding to the first support opening portion 18 and the frame 7.

An example of a material that constitutes the first base insulating layer 62 includes an insulating material such as a synthetic resin including a polyimide resin, a polyamide imide resin, an acrylic resin, a polyether nitrile resin, a polyether sulfone resin, a polyethylene terephthalate resin, a polyethylene naphthalate resin, and a polyvinyl chloride resin. Preferably, a polyimide resin is used. The first base insulating layer 62 has a thickness of, for example, 1 μm or more, or preferably 4 μm or more, and of, for example, 30 μm or less, or preferably 10 μm or less.

As referred in FIGS. 6 and 10A to 10D, the first conductive layer 63 is provided on the first base insulating layer 62. Although described in detail later, the first conductive layer 63 fills the first base opening portion 71 (described later) in the first base insulating layer 62. The first conductive layer 63 includes a part of a plurality of the conductive patterns 20, to be specific, as shown in FIG. 2, includes the first front-side terminal 41, the second front-side terminal 42, and the seventh front-side terminal 47 (the light emitting-side terminals 17); a part of the first wire 51 (the front-side portion (a first connecting portion 49 to be described later) and a midway portion in the front-rear direction (the first crossing portion 48 to be described later)), a part of the second wire 52 (the front-side portion (a second connecting portion 77 to be described later)), and a part of the seventh wire 57 (the front-side portion (the third connecting portion 78 to be described later)); and the branch wire 59.

An example of a material that constitutes the first conductive layer 63 includes a conductive material such as copper, nickel, gold, and solder or alloys thereof. Preferably, copper is used. The first conductive layer 63 has a thickness of, for example, 1 μm or more, or preferably 4 μm or more, and of, for example, 30 μm or less, or preferably 20 μm or less. Each of a plurality of the light emitting-side terminals 17 has a width and a length (a length in the front-rear direction) of, for example, 15 μm or more, or preferably 20 μm or more, and of, for example, 1000 μm or less, or preferably 800 μm or less. Each of a plurality of the wires 50 included in the first conductive layer 63 has a width of, for example, 5 μm or more, or preferably 9 μm or more, and of, for example, 500 μm or less, or preferably 200 μm or less. A gap between the rear-side terminals 30, a gap between the front-side terminals 40 included in the first conductive layer 63, and a gap between the wires 50 included in the first conductive layer 63 are, for example, 5 μm or more, or preferably 9 μm or more, and are, for example, 200 μm or less, or preferably 100 μm or less.

As shown in FIGS. 4, 5, and 11A to 11D, the first electroless plating layer 64 is formed on the surfaces (the upper surface and the side surfaces) of the first conductive layer 63 and on a portion excluding the surfaces of the light emitting-side terminals 17 (the first front-side terminal 41, the second front-side terminal 42, and the seventh front-side terminal 47). That is, the first electroless plating layer 64 is formed on the surface of the first conductive layer 63 that is covered with the second base insulating layer 65 to be described next. That is, the first electroless plating layer 64 is formed on the upper surfaces and the side surfaces of the light emitting-side terminals 17, the above-described part of the first wire 51 in the first conductive layer 63, a part of the second wire 52, a part of the seventh wire 57, and the upper surface and the side surfaces of the branch wire 59. An example of a plating material that forms the first electroless plating layer 64 includes a metal protective material such as nickel and tin. Preferably, in view of excellent protection of the first conductive layer 63, nickel is used. The first electroless plating layer 64 has a thickness of, for example, 0.001 μm or more, or preferably 0.01 μm or more, and of, for example, 5 μm or less, or preferably 1 μm or less.

As shown in FIGS. 4, 5, and 12A to 12D, the second base insulating layer 65 is disposed on the first base insulating layer 62 so as to cover the first electroless plating layer 64. The second base insulating layer 65 is formed corresponding to the second conductive layer 66 to be described next. The second base insulating layer 65 is formed into a pattern of including the front-side terminal 40 in the front-side portion of the terminal opening portion 10, when projected in the thickness direction. That is, the rear end edge of the second base insulating layer 65 is disposed at the rear side with respect to the rear end edge of the light emitting-side terminal 17. As referred in FIG. 1, in the second base insulating layer 65, as third opening portions to be described in detail later, third base opening portions 73, fourth base opening portions 74, and a fifth base opening portion 75, and as a third opening portion, a sixth base opening portion 76 are provided. An example of a material that constitutes the second base insulating layer 65 includes the insulating material illustrated in the first base insulating layer 62. The second base insulating layer 65 has a thickness of, for example, 1 μm or more, or preferably 2 μm or more, and of, for example, 30 μm or less, or preferably 10 μm or less.

As shown in FIGS. 4, 5, and 13A to 13D, the second conductive layer 66 is provided on the second base insulating layer 65. Although described in detail later, the second conductive layer 66 fills the third base opening portions 73 to the sixth base opening portion 76. The second conductive layer 66 includes a remaining portion other than the first conductive layer 63 of a plurality of the conductive patterns 20, to be specific, as shown in FIG. 3, includes the entire plurality of the rear-side terminals 30 (the first rear-side terminal 31 to the seventh rear-side terminal 37), the slider-side terminals 16 (the third front-side terminal 43 to the sixth front-side terminal 46), the remaining portion (that is, a rear divided portion 82 and a front divided portion 83 to be described later) of the first wire 51, the second wire 52 to the sixth wire 56, and the remaining portion (the rear-side portion) of the seventh wire 57. The second conductive layer 66 further includes the auxiliary wires 58. An example of a material that constitutes the second conductive layer 66 includes the conductive material illustrated in the first conductive layer 63. The second conductive layer 66 has a thickness of, for example, 1 μm or more, or preferably 4 μm or more, and of, for example, 30 μm or less, or preferably 20 μm or less. The width and the length of each of a plurality of the rear-side terminals 30 and each of the slider-side terminals 16 are the same as those of each of the light emitting-side terminals 17 described above. The width of each of a plurality of the wires 50 included in the second conductive layer 66 is the same as that of each of a plurality of the wires 50 included in the first conductive layer 63. A gap between the rear-side terminals 30, a gap between the slider-side terminals 16, and a gap between the wires 50 included in the second conductive layer 66 are, for example, 10 μm or more, or preferably 20 μm or more, and are, for example, 200 μm or less, or preferably 100 nm or less.

As shown in FIGS. 4, 5, and 14A to 14D, the second electroless plating layer 67 is formed on the surfaces (the upper surface and the side surfaces) of the second conductive layer 66 and on a portion excluding the surfaces of the rear-side terminals 30 and the slider-side terminals 16 (the front-side terminals 40). That is, the second electroless plating layer 67 is formed on the upper surfaces and the side surfaces of a plurality of the wires 50 included in the second conductive layer 66. An example of a plating material that constitutes the second electroless plating layer 67 includes the plating material illustrated in the first electroless plating layer 64. The thickness of the second electroless plating layer 67 is the same as that of the first electroless plating layer 64.

As shown in FIGS. 4, 5, and 15A to 15D, the cover insulating layer 68 is disposed on the second base insulating layer 65 so as to cover the second electroless plating layer 67. On the other hand, the cover insulating layer 68 is formed into a pattern of exposing the surfaces (the upper surfaces and the side surfaces) of the slider-side terminals 16. An example of a material that constitutes the cover insulating layer 68 includes the insulating material illustrated in the first base insulating layer 62. The cover insulating layer 68 has a thickness of, for example, 1 μm or more, or preferably 2 μm or more, and of, for example, 30 μm or less, or preferably 5 μm or less.

As shown in FIGS. 4, 5, and 16A to 16D, the electrolytic plating layer 69 is formed on the surfaces (the upper surfaces and the side surfaces) of the rear-side terminals 30 (external-side terminals 15), the surfaces (the upper surfaces and the side surfaces) of the slider-side terminals 16 of the front-side terminals 40, and the back surfaces (the lower surfaces) of the light emitting-side terminals 17. The electrolytic plating layer 69 is also formed on the back surface (the lower surface) of the first conductive layer 63 filling the first base opening portions 71. An example of a material that constitutes the electrolytic plating layer 69 includes a metal protective material such as gold, chromium, and nickel or alloys thereof. Preferably, gold and nickel are used, or more preferably, nickel is used. The electrolytic plating layer 69 has a thickness of, for example, 0.01 μm or more, and of, for example, 10 μm or less, or preferably 5 μm or less.

<Details of Opening Portion in Base Insulating Layer and Conductive Pattern>

Next, the opening portions in the first base insulating layer 62 and the second base insulating layer 65 and a plurality of the conductive patterns 20 corresponding thereto are described in detail.

<First Base Insulating Layer 62>

As referred in FIGS. 9A to 9D, the first base opening portions 71 and the second base opening portions 72 that penetrate in the thickness direction of the first base insulating layer 62 are provided in the first base insulating layer 62.

(First Base Opening Portion 71)

As referred in FIG. 1, a plurality of the first base opening portions 71 are provided corresponding to the first conductive pattern 21, the second conductive pattern 22, and the seventh conductive pattern 27 in the first conductive layer 63 (ref: FIGS. 6 and 7). Each of a plurality of the first base opening portions 71 is formed into a generally circular shape in plane view. The first base opening portions 71 have a base opening portion corresponding to the second support opening portion 19 and base opening portions corresponding to the third support opening portions 38.

As referred in FIGS. 1 and 5, the first base opening portion 71 corresponding to the second support opening portion 19 is, in plane view, provided so as to be included in the second support opening portion 19, to be specific, is disposed at the rear-side portion of the second support opening portion 19.

The first base opening portions 71 corresponding to the third support opening portions 38 are, in plane view, provided so as to be included in the third support opening portions 38.

(Second Base Opening Portion 72)

As referred in FIGS. 1 and 3, a plurality of the second base opening portions 72 are provided corresponding to the first conductive pattern 21 to the seventh conductive pattern 27 in the second conductive layer 66. To be specific, the second base opening portions 72 corresponding to the first conductive pattern 21 to the fourth conductive pattern 24 correspond to the external-side terminals 15. To be more specific, the second base opening portions 72 corresponding to the first conductive pattern 21 to the fourth conductive pattern 24 are provided corresponding to each of the first rear-side terminal 31, the second rear-side terminal 32, the third rear-side terminal 33, and the fourth rear-side terminal 34. As referred in FIGS. 5 and 6, the second base opening portions 72 corresponding to the first conductive pattern 21 to the fourth conductive pattern 24 are, in plane view, provided so as to be included in the first support opening portion 18.

On the other hand, as referred in FIG. 1, the second base opening portion 72 corresponding to the seventh conductive pattern 27 is provided on the frame 7.

<Second Base Insulating Layer 65>

The third base opening portions 73 to the sixth base opening portion 76 that penetrate in the thickness direction of the second base insulating layer 65 are provided in the second base insulating layer 65.

(Third Base Opening Portion 73)

A plurality of the third base opening portions 73 are provided corresponding to the first base opening portion 71. To be specific, the third base opening portions 73 have a single piece of base opening portion corresponding to the second support opening portion 19 and a plurality (two pieces) of base opening portions corresponding to the third support opening portions 38. As shown in FIG. 12, each of a plurality (three pieces) of the third base opening portions 73 is, in plane view, disposed at the same position as that of each of a plurality (three pieces) of the first base opening portions 71. In this way, each of a plurality (three pieces) of the third base opening portions 73 communicates with each of a plurality (three pieces) of the first base opening portions 71. Each of a plurality (three pieces) of the third base opening portions 73 is formed into a generally circular shape in plane view that is slightly larger than each of a plurality (three pieces) of the first base opening portions 71. Each of a plurality of the third base opening portions 73 is, in plane view, formed into a pattern of including each of a plurality of the first base opening portions 71.

(Fourth Base Opening Portion 74)

A plurality (four pieces) of the fourth base opening portions 74 are provided corresponding to the second base opening portions 72 so as to penetrate in the thickness direction of the second base insulating layer 65. To be specific, as referred in FIG. 1, each of a plurality (four pieces) of the fourth base opening portions 74 is provided corresponding to each of the first rear-side terminal 31, the second rear-side terminal 32, the third rear-side terminal 33, and the fourth rear-side terminal 34. Furthermore, the fourth base opening portion 74 is provided corresponding to the rear end portion of the auxiliary wires 58 in the seventh conductive pattern 27. As shown in FIG. 12, in plane view, each of a plurality (five pieces) of the fourth base opening portions 74 is disposed at the same position as that of each of a plurality (five pieces) of the second base opening portions 72 and in this way, communicates with each of a plurality (five pieces) of the second base opening portions 72. Each of a plurality (five pieces) of the fourth base opening portions 74 is formed into a generally circular shape in plane view that is slightly larger than each of a plurality (five pieces) of the second base opening portions 72. Each of a plurality of the fourth base opening portions 74 is, in plane view, formed into a pattern of including each of a plurality of the second base opening portions 72.

(Fifth Base Opening Portion 75)

Figure 12A:
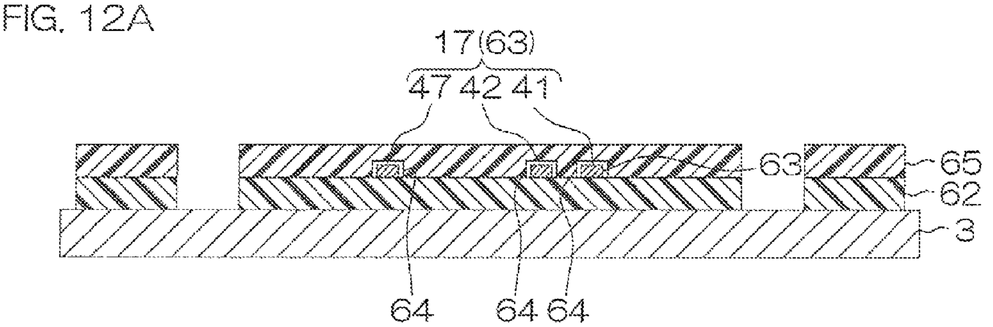
FIGS. 12A to 12D show the steps of providing a second base insulating layer in the method for producing a suspension board with circuit in FIG. 1 and each of FIGS. 12A to 12D corresponds to each of FIGS. 4 to 7.
Figure 12B:
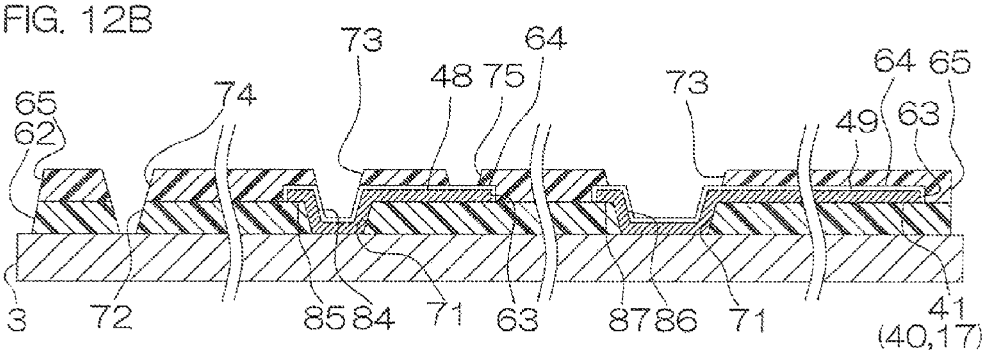
Figure 12C:
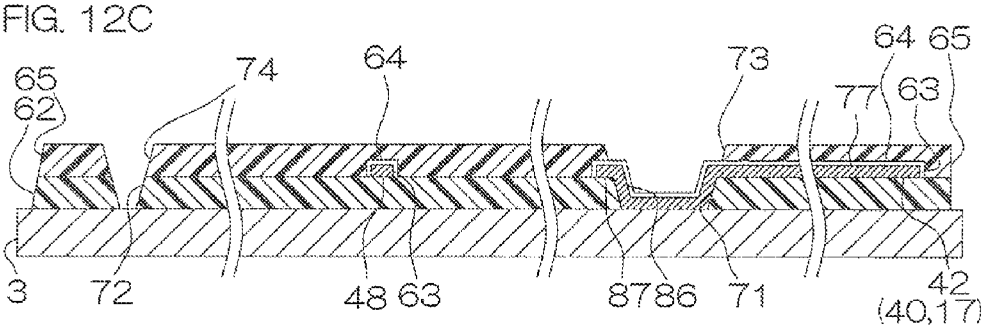

As shown in FIG. 5, the fifth base opening portion 75 is formed into a shape that penetrates in the thickness direction of the second base insulating layer 65. As referred in FIG. 1, a single piece of the fifth base opening portion 75 is provided so as to make a pair with a single piece of the third base opening portion 73 that corresponds to the second support opening portion 19. That is, the fifth base opening portion 75 is disposed in opposed relation to the third base opening portion 73 that corresponds to the second support opening portion 19 at spaced intervals to the diagonally left side at the front side. As shown in FIG. 12B, the fifth base opening portion 75 exposes the first electroless plating layer 64 that is provided in the first crossing portion 48 (described later). The fifth base opening portion 75 is formed into a generally circular shape in plane view.

(Sixth Base Opening Portion 76)

Figure 12D:
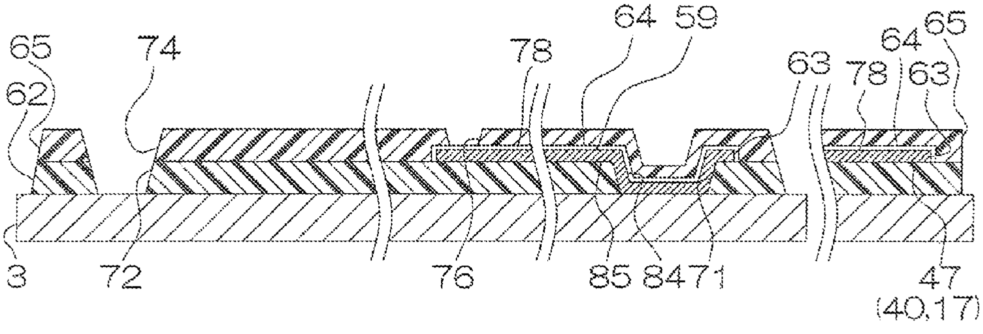

As referred in FIGS. 1 and 12D, the sixth base opening portion 76 is formed into a shape that penetrates in the thickness direction of the second base insulating layer 65 and is disposed at a position that is different from that of the first base opening portion 71 in the third support opening portion 38 at the left side. To be specific, the sixth base opening portion 76 is provided at the left end portion of the folded-back portion 14 and to be more specific, is disposed at spaced intervals to the diagonally lower side at the left side with respect to the first base opening portion 71 in the third support opening portion 38 at the left side. The sixth base opening portion 76 exposes the first electroless plating layer 64 that is provided at the left end portion of the third connecting portion 78 (described later). The sixth base opening portion 76 is formed into a generally circular shape in plane view.

<A Plurality of Conductive Patterns 20>

As shown in FIG. 1, a plurality of the conductive patterns 20 include the first conductive pattern 21 to the seventh conductive pattern 27 that are insulated from each other. Hereinafter, of a plurality of the conductive patterns 20, the first conductive pattern 21, the second conductive pattern 22, and the seventh conductive pattern 27 in which a part thereof fills one embodiment of the first opening portion to the fourth opening portion of the present invention are described in detail.

<First Conductive Pattern 21>

The first conductive pattern 21 includes the first rear-side terminal 31, the first front-side terminal 41, and the first wire 51 that electrically connects the first rear-side terminal 31 to the first front-side terminal 41.

(First Rear-Side Terminal 31)

In the rear-side terminals 30, the first rear-side terminal 31 is the external-side terminal 15 that is disposed at the right-most side and as shown in FIGS. 3 and 5, is included in the second conductive layer 66. The rear end portion of the first rear-side terminal 31 is provided on the upper surface of the terminal support portion 96 so as to fill the inside of the second base opening portion 72 and the fourth base opening portion 74, while the front end portion and a midway portion in the front-rear direction of the first rear-side terminal 31 are provided on the upper surface of the second base insulating layer 65. To be more specific, the rear end portion of the first rear-side terminal 31 is provided along the inner circumference side surfaces of the second base opening portion 72 and the fourth base opening portion 74. In the rear end portion of the first rear-side terminal 31, in a portion filling the inside of the second base opening portion 72 and the fourth base opening portion 74, to be specific, in a sunk portion, a first concave portion 80 that is gradually dented downwardly from a portion provided on the upper surface of the second base insulating layer 65 toward the inner side is provided. In the rear end portion of the first rear-side terminal 31, a first expanded portion 81 is provided on the upper surface of the second base insulating layer 65 so as to form a generally annulus ring shape in plane view that expands outwardly from the outer circumference edge of the first concave portion 80.

(First Front-Side Terminal 41)

As shown in FIGS. 2 and 5, the first front-side terminal 41 is the light emitting-side terminal 17 that is electrically connected to the light emitting element 39 and is included in the first conductive layer 63. The surfaces (the upper surface and the side surfaces) of the first front-side terminal 41 is covered with the second base insulating layer 65 via the first electroless plating layer 64. On the other hand, the electrolytic plating layer 69 is laminated on the back surface (the lower surface) of the first front-side terminal 41.

(First Wire 51)

As shown in FIGS. 1 and 5, the first wire 51 is continuous to the first rear-side terminal 31 and the first front-side terminal 41 and is included in the first conductive layer 63 and the second conductive layer 66.

[First Wire 51 Included in First Conductive Layer 63]

As shown in FIGS. 2 and 5, the first wire 51 included in the first conductive layer 63 includes the first crossing portion 48 that corresponds to the second support opening portion 19 and the first connecting portion 49 that is connected to the first front-side terminal 41.

As shown in FIG. 2, the first crossing portion 48 is, in plane view, provided so as to be included in the second support opening portion 19 and to be specific, is formed into a linear shape that gradually inclines to the left side toward the front side. As shown in FIG. 5, the rear end portion of the first crossing portion 48 fills the inside of the first base opening portion 71 at the inside of the second support opening portion 19, while the front end portion and a midway portion in the front-rear direction of the first crossing portion 48 are provided on the upper surface of the first base insulating layer 62. To be more specific, the rear end portion of the first crossing portion 48 is provided along the inner circumference side surface of the first base opening portion 71. In the rear end portion of the first rear-side terminal 31, in a portion filling the inside of the first base opening portion 71, to be specific, in a sunk portion, a second concave portion 84 that is gradually dented downwardly from a portion provided on the upper surface of the second base insulating layer 65 toward the inner side is provided. On the other hand, the back surface (the lower surface) of the second concave portion 84 is exposed from the first base opening portion 71. In the rear end portion of the first rear-side terminal 31, a second expanded portion 85 is provided on the upper surface of the first base insulating layer 62 so as to form a generally annulus ring shape in plane view that expands outwardly from the outer circumference edge of the second concave portion 84.

As shown in FIG. 2, the first connecting portion 49 is formed into a generally linear pattern of extending from the first front-side terminal 41 toward the front side, crossing the front end edge of the terminal opening portion 10, reaching the folded-back portion 14, and then, reaching the first base opening portion 71. As shown in FIG. 1, the front end portion of the first connecting portion 49 fills the inside of the first base opening portion 71 provided in the folded-back portion 14. In the front end portion of the first connecting portion 49, in a portion filling the first base opening portion 71, to be specific, in a sunk portion, a third concave portion 86 that is gradually dented downwardly from a portion provided on the upper surface of the first base insulating layer 62 toward the inner side is provided. The electrolytic plating layer 69 is laminated on the back surface (the lower surface) of the third concave portion 86. In the front end portion of the first connecting portion 49, a third expanded portion 87 is provided on the upper surface of the first base insulating layer 62 so as to form a generally annulus ring shape in plane view that expands outwardly from the third concave portion 86.

[First Wire 51 Included in Second Conductive Layer 66]

As shown in FIG. 3, the first wire 51 included in the second conductive layer 66 includes the rear divided portion 82 and the front divided portion 83 that is provided at the front side of the rear divided portion 82.

The rear divided portion 82 is, in plane view, provided at the outer side (the right side in the main body portion 5) with respect to the second wire 52. To be specific, as shown in FIGS. 3 and 5, on the upper surface of the second base insulating layer 65, the rear divided portion 82 is formed into a linear pattern of extending from the first rear-side terminal 31 toward the front side and crossing the rear end edge of the second support opening portion 19. The rear divided portion 82 is formed into a generally linear shape that reaches the third base opening portion 73 at the inside of the second support opening portion 19. The front end portion of the rear divided portion 82 fills the inside of the third base opening portion 73 in the second base insulating layer 65 and the second concave portion 84 in the first conductive layer 63. To be specific, the front end portion of the rear divided portion 82 is continuously provided along the inner circumference side surface of the third base opening portion 73 and the inner circumference side surface and the bottom surface (the upper surface) of the second concave portion 84. To be more specific, the first electroless plating layer 64 is interposed between the front end portion of the rear divided portion 82 and the second concave portion 84. In this way, the front end portion of the rear divided portion 82 is in contact with the first electroless plating layer 64 provided in the second concave portion 84 in the first crossing portion 48.

Figures 13A, 13B, 13C, 13D:
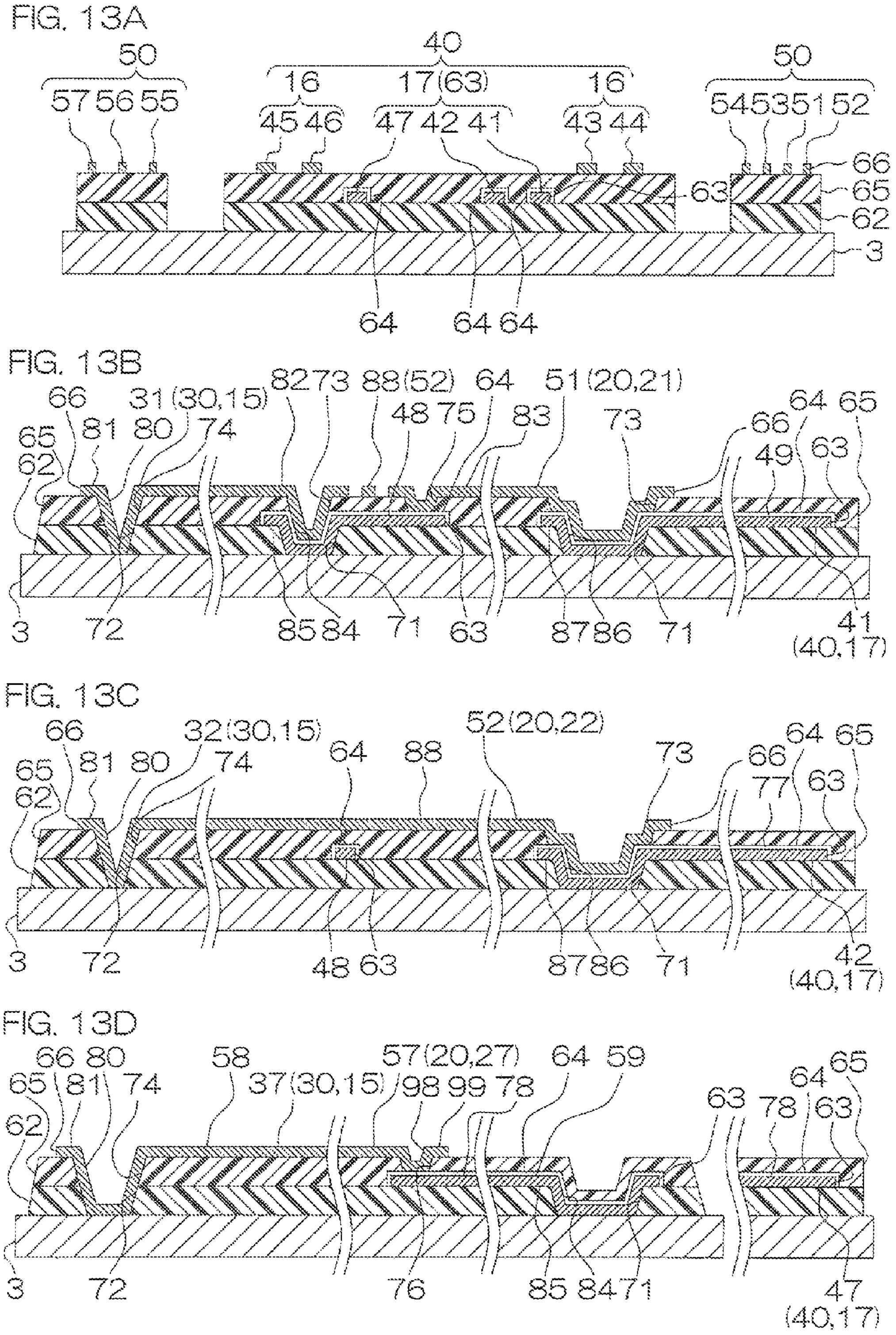
FIGS. 13A to 13D show the steps of providing a second conductive layer in the method for producing a suspension board with circuit in FIG. 1 and each of FIGS. 13A to 13D corresponds to each of FIGS. 4 to 7.

As shown in FIG. 3, the front divided portion 83 is, in plane view, provided at the inner side (the left side in the main body portion 5) with respect to the second wire 52. To be more specific, as shown in FIGS. 1 and 5, on the upper surface of the second base insulating layer 65, the front divided portion 83 is formed into a pattern of connecting the third base opening portion 73 at the inside of the third support opening portion 38 to the fifth base opening portion 75 at the inside of the second support opening portion 19. To be specific, the front divided portion 83 is formed into a pattern of extending, in the folded-back portion 14, from the third base opening portion 73 at the inside of the third support opening portion 38 toward the right side, extending toward the rear side along the outrigger portion 12, extending along a generally linear shape extending in the front-rear direction at the right end portion of the main body portion 5, and then, reaching the fifth base opening portion 75 at the inside of the second support opening portion 19 in the main body portion 5. The rear end portion of the front divided portion 83 fills the inside of the fifth base opening portion 75 at the inside of the second support opening portion 19. To be more specific, the rear end portion of the front divided portion 83 is continuously provided along the inner circumference side surface and the bottom surface (the upper surface) of the fifth base opening portion 75. Furthermore, as shown in FIG. 13B, the rear end portion of the front divided portion 83 is formed on the upper surface of the first electroless plating layer 64 that is exposed from the fifth base opening portion 75. That is, the rear end portion of the front divided portion 83 is in contact with the first electroless plating layer 64 provided in the front end portion of the first crossing portion 48. On the other hand, as shown in FIG. 5, the front end portion of the front divided portion 83 fills the third base opening portion 73 at the inside of the third support opening portion 38 and the third concave portion 86 in the first conductive layer 63. To be more specific, the front end portion of the front divided portion 83 is continuously provided along the inner circumference side surface of the third base opening portion 73 and the inner circumference side surface and the bottom surface (the upper surface) of the third concave portion 86. To be more specific, the first electroless plating layer 64 is interposed between the front end portion of the front divided portion 83 and the third concave portion 86.

In the first wire 51 in the first conductive pattern 21, the front divided portion 83 is electrically connected to the rear divided portion 82 via the first crossing portion 48. The front end portion of the front divided portion 83 is connected to the first connecting portion 49 at the inside of the first base opening portion 71 and the third base opening portion 73. The front divided portion 83 is electrically connected to the first front-side terminal 41 via the first connecting portion 49. On the other hand, the rear end portion of the rear divided portion 82 is electrically connected to the first rear-side terminal 31.

<Second Conductive Pattern 22>

As shown in FIG. 1, the second conductive pattern 22 includes the second rear-side terminal 32, the second front-side terminal 42, and the second wire 52 that electrically connects the second rear-side terminal 32 to the second front-side terminal 42.

(Second Rear-Side Terminal 32)

The second rear-side terminal 32 is disposed at spaced intervals to the left side of the first rear-side terminal 31. The second rear-side terminal 32 is formed into the same shape as that of the first rear-side terminal 31. That is, as shown in FIG. 6, the second rear-side terminal 32 is included in the second conductive layer 66 and includes the first concave portion 80 and the first expanded portion 81 that have the same structure as that of the first rear-side terminal 31.

(Second Front-Side Terminal 42)

As shown in FIG. 2, the second front-side terminal 42 is disposed at spaced intervals to the left side of the first front-side terminal 41. The second front-side terminal 42 is formed into the same shape as that of the first front-side terminal 41. That is, as shown in FIG. 6, the second rear-side terminal 32 is included in the first conductive layer 63.

(Second Wire 52)

As shown in FIG. 1, the second wire 52 is continuous to the second rear-side terminal 32 and the second front-side terminal 42. Furthermore, as shown in FIGS. 1 and 5, the second wire 52 is disposed so as to be sandwiched between the rear divided portion 82 and the front divided portion 83 in the first wire 51. As shown in FIG. 6, the second wire 52 is included in the first conductive layer 63 and the second conductive layer 66.

[Second Wire 52 Included in First Conductive Layer 63]

As shown in FIG. 2, the second wire 52 included in the first conductive layer 63 includes the second connecting portion 77 that is connected to the second front-side terminal 42.

The second connecting portion 77 has, in plane view, substantially the same layered structure as that of the first connecting portion 49, except that the second connecting portion 77 is provided at spaced intervals to the left side and the front side of the first connecting portion 49. That is, as referred in FIGS. 5 and 6, the front end portion of the second connecting portion 77 includes the third concave portion 86 and the third expanded portion 87 having the same structure as that of the first connecting portion 49.

[Second Wire 52 Included in Second Conductive Layer 66]

As shown in FIG. 3, the second wire 52 included in the second conductive layer 66 is, when projected in the thickness direction, formed into a crossing pattern of continuously extending in the front-rear direction and having a second crossing portion 88 that crosses the first crossing portion 48 (ref: FIGS. 1 and 2). To be specific, as shown in FIGS. 3 and 6, on the upper surface of the second base insulating layer 65, the second wire 52 included in the second conductive layer 66 is, in plane view, formed into a pattern of extending from the second rear-side terminal 32 toward the front side and sequentially crossing the rear end edge and the front end edge of the second support opening portion 19. At the inside of the second support opening portion 19, the second wire 52 included in the second conductive layer 66 constitutes the second crossing portion 88. The second crossing portion 88 is formed into a linear shape that gradually inclines to the right side toward the front side. The second wire 52 included in the second conductive layer 66 reaches the inside of the third concave portion 86 at the inside of the third support opening portion 38 and fills the inside of the third concave portion 86. The embodiment in which the second wire 52 fills the third concave portion 86 is the same as the embodiment in which the first wire 51 fills the third concave portion 86.

<Seventh Conductive Pattern 27>

As shown in FIG. 1, the seventh conductive pattern 27 includes the seventh rear-side terminal 37, the seventh front-side terminal 47, the seventh wire 57 that electrically connects the seventh rear-side terminal 37 to the seventh front-side terminal 47, the auxiliary wires 58, and the branch wire 59.

(Seventh Rear-Side Terminal 37)

As shown in FIGS. 3 and 7, the seventh rear-side terminal 37 is the external-side terminal 15 that is disposed at the left-most side and is included in the second conductive layer 66.

(Seventh Front-Side Terminal 47)

As shown in FIGS. 2 and 7, the seventh front-side terminal 47 is, in plane view, disposed in opposed relation at spaced intervals to the left side of the second front-side terminal 42. As shown in FIG. 1, of the fifth front-side terminal 45 to the seventh front-side terminal 47, the seventh front-side terminal 47 is disposed at the right-most side. The seventh front-side terminal 47 is formed into the same shape as that of the first front-side terminal 41. That is, as shown in FIG. 7, the seventh front-side terminal 47 is included in the first conductive layer 63. The back surface (the lower surface) of the seventh front-side terminal 47 is covered with the electrolytic plating layer 69.

(Seventh Wire 57)

As shown in FIGS. 1 and 7, the seventh wire 57 is continuous to the seventh rear-side terminal 37 and the seventh front-side terminal 47 and is included in the first conductive layer 63 and the second conductive layer 66.

[Seventh Wire 57 Included in First Conductive Layer 63]

As shown in FIG. 2, the seventh wire 57 included in the first conductive layer 63 includes the third connecting portion 78 that is connected to the seventh front-side terminal 47.

The third connecting portion 78 is formed into a generally L-shape in plane view. The bent portion thereof is included in the inside of the third support opening portion 38 and in this way, the third connecting portion 78 is provided in a pattern of passing through the third support opening portion 38. To be specific, the third connecting portion 78 extends from the seventh front-side terminal 47 toward the front side; in the folded-back portion 14, crosses the rear end edge of the third support opening portion 38 at the left side; thereafter, bends toward the left side; and subsequently, crosses the left end edge of the third support opening portion 38 to reach the front end portion of the left-side portion of the folded-back portion 14.

[Seventh Wire 57 Included in Second Conductive Layer 66]

As shown in FIG. 3, the seventh wire 57 included in the second conductive layer 66 is formed into a pattern of extending in the front-rear direction in the main body portion 5 and the gimbal portion 6. The seventh wire 57 included in the second conductive layer 66 is disposed in a pattern in which the front end portion thereof is positioned at the left side portion of the folded-back portion 14 and the rear end portion thereof is continuously connected to the front end portion of the seventh rear-side terminal 37. As shown in FIG. 7, the front end portion of the seventh wire 57 included in the second conductive layer 66 is provided on the upper surface of the first electroless plating layer 64 that is exposed from the sixth base opening portion 76 so as to fill the inside of the sixth base opening portion 76 (ref: FIGS. 12D and 13D). To be more specific, the front end portion of the seventh wire 57 included in the second conductive layer 66 is continuously provided along the inner circumference side surface of the sixth base opening portion 76 and along the upper surface of the first electroless plating layer 64 that is exposed from the sixth base opening portion 76.

(Auxiliary Wire 58)

As shown in FIGS. 3 and 7, each of the auxiliary wires 58 is included in the second conductive layer 66 and is formed into a shape of extending from the rear end portion of the seventh rear-side terminal 37 toward the rear side. The auxiliary wire 58 is formed into a pattern in which the rear end portion thereof reaches the frame 7. The rear end portion of the auxiliary wire 58 is provided on the upper surface of the frame 7 so as to fill the inside of the second base opening portion 72 in the first base insulating layer 62 and the fourth base opening portion 74 in the second base insulating layer 65 in the frame 7. To be specific, the rear end portion of the auxiliary wire 58 is continuously provided along the inner circumference side surfaces of the second base opening portion 72 and the fourth base opening portion 74 and along the upper surface of the frame 7 that is exposed from the second base opening portion 72 and the fourth base opening portion 74.

(Branch Wire 59)

As shown in FIGS. 2 and 7, the branch wire 59 is a wire that branches off from the seventh wire 57 included in the first conductive layer 63 toward the front side and is provided on the upper surface of the first base insulating layer 62. The front end portion of the branch wire 59 fills the inside of the first base opening portion 71 at the inside of the third support opening portion 38 at the left side. In the front end portion of the branch wire 59, the second concave portion 84 and the second expanded portion 85 having the same structure as that of the above-described first crossing portion 48 are provided.

In the seventh conductive pattern 27, the seventh wire 57 included in the second conductive layer 66 is electrically connected to the seventh rear-side terminal 37 and the seventh rear-side terminal 37 is electrically connected to the frame 7 via the auxiliary wire 58. The seventh wire 57 included in the second conductive layer 66 is electrically connected to the seventh front-side terminal 47 via the third connecting portion 78 included in the first conductive layer 63.

<Third Conductive Pattern 23 to Sixth Conductive Pattern 26>

Next, the conductive patterns other than the first conductive pattern 21, the second conductive pattern 22, and the seventh conductive pattern 27 (that is, the third conductive pattern 23 to the sixth conductive pattern 26) are briefly described.

As shown in FIG. 1, the third conductive pattern 23 integrally includes the third rear-side terminal 33, the third front-side terminal 43, and the third wire 53. The fourth conductive pattern 24 integrally includes the fourth rear-side terminal 34, the fourth front-side terminal 44, and the fourth wire 54. The fifth conductive pattern 25 integrally includes the fifth rear-side terminal 35, the fifth front-side terminal 45, the fifth wire 55, and the auxiliary wire 58. The sixth conductive pattern 26 integrally includes the sixth rear-side terminal 36, the sixth front-side terminal 46, the sixth wire 56, and the auxiliary wire 58.

The layered structure of the third rear-side terminal 33 and the fourth rear-side terminal 34 is the same as that of the above-described first rear-side terminal 31 (ref: FIG. 5). The layered structure of the fifth rear-side terminal 35 and the sixth rear-side terminal 36 is the same as that of the above-described seventh rear-side terminal 37 (ref: FIG. 7).

As shown in FIG. 4, the third front-side terminal 43 to the sixth front-side terminal 46 and the third wire 53 to the sixth wire 56 are provided on the upper surface of the second base insulating layer 65.

As referred in FIG. 1, the layered structure of the auxiliary wire 58 is the same as that of the auxiliary wire 58 of the seventh conductive pattern 27 (ref: FIG. 7). A plurality of the auxiliary wires 58 are formed into a pattern of extending in a bundled state from the rear end portions of the fifth rear-side terminal 35 to the seventh rear-side terminal 37 toward the rear side to be unified in the frame 7.

[Method for Producing Suspension Board with Circuit 1]

Next, a method for producing the suspension board with circuit 1 is described with reference to FIGS. 8A to 20D.

First, in this method, as shown in FIGS. 8A to 8D, the metal supporting board 3 is prepared. For example, the metal supporting board 3 in a generally rectangular shape is prepared.

<Step of Providing First Base Insulating Layer 62>

((1) One Example of Step of Providing First Insulating Layer)

Next, in this method, as shown in FIGS. 9A to 9D, the first base insulating layer 62 is provided on the upper surface of the metal supporting board 3 so as to provide the first base opening portions 71 and the second base opening portions 72 described above.

In order to provide the first base insulating layer 62 on the upper surface of the metal supporting board 3, for example, a varnish of an insulating material having photosensitivity is applied onto the metal supporting board 3 to be dried. Thereafter, the resulting laminate is exposed to light and developed to be then cured by heating. Or, a sheet of an insulating material in which the first base opening portion 71 and the second base opening portion 72 are provided in advance is attached onto the metal supporting board 3. Preferably, a varnish of an insulating material having photosensitivity is applied onto the metal supporting board 3 to be dried. Thereafter, the resulting laminate is exposed to light and developed to be then cured by heating.

<Step of Providing First Conductive Layer 63>

((2) One Example of Step of Providing First Conductive Layer)

Figure 10A:
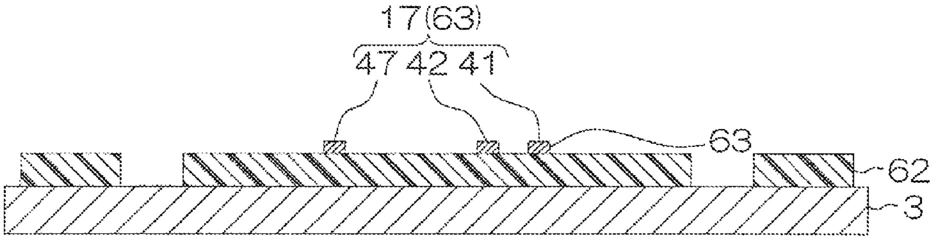
FIGS. 10A to 10D show the steps of providing a first conductive layer in the method for producing a suspension board with circuit in FIG. 1 and each of FIGS. 10A to 10D corresponds to each of FIGS. 4 to 7.
Figure 10B:
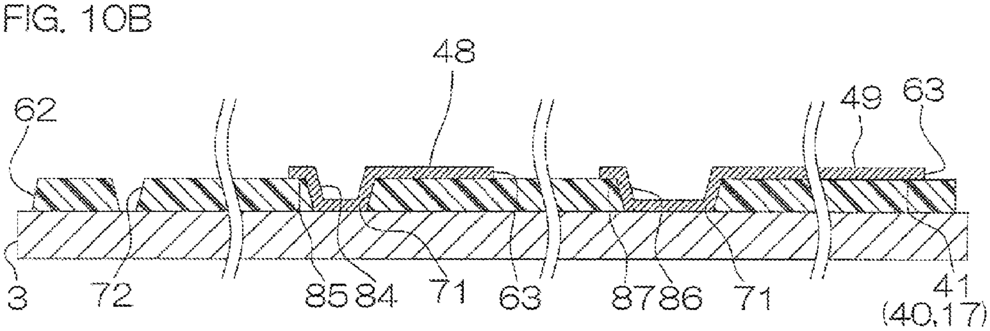
Figure 10C:
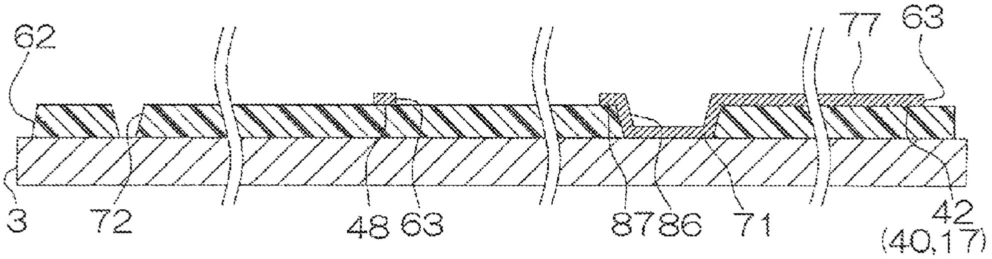
Figure 10D:
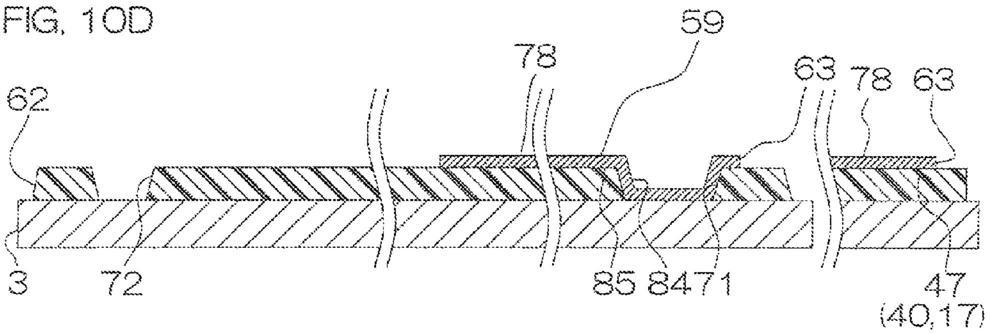

Next, in this method, as shown in FIGS. 10A and 10D, the first conductive layer 63 is provided on the first base insulating layer 62 and the metal supporting board 3 so as to fill the inside of each of the first base opening portions 71.

Examples of a method for providing the first conductive layer 63 include an additive method and a subtractive method. Preferably, an additive method is used.

<Step of Providing First Electroless Plating Layer 64>

((3) One Example of Step of Providing First Electroless Plating Layer)

Next, in this method, as shown in FIGS. 11A to 11D, the first electroless plating layer 64 is provided on the surfaces (the upper surface and the side surfaces) of the first conductive layer 63 by electroless plating.

In the electroless plating, for example, a laminate of the metal supporting board 3, the first base insulating layer 62, and the first conductive layer 63 described above is immersed into a plating solution including an ion of the above-described plating material (preferably, nickel). The conditions for the above-described electroless plating are capable of being in conformity with known conditions. Among all, in the embodiment, the electroless plating time, that is, the immersion time, is capable of being set to be short. As shown in FIGS. 10B to 10D, even when the immersion time is set to be short, the first conductive layer 63 is in contact with the upper surface of the metal supporting board 3 that is exposed from the first base opening portion 71, so that the first electroless plating layer 64 on the surface of the first conductive layer 63 is capable of being surely and stably deposited. Thus, on the surface of the metal supporting board 3, attachment of the plating material for constituting the first electroless plating layer 64 is capable of being suppressed. The immersion time depends on the composition of a plating solution, a thickness of the first electroless plating layer 64 to be aimed at, or the like and is, for example, 10 minutes or less, preferably 5 minutes or less, or more preferably 2 minutes or less, and is, for example, 0.1 minutes or more.

<Step of Providing Second Base Insulating Layer 65>

((4) One Example of Step of Providing Second Insulating Layer)

Next, in this method, as shown in FIGS. 12A to 12D, the second base insulating layer 65 is provided on the first base insulating layer 62 so as to cover the first electroless plating layer 64. The second base insulating layer 65 is provided so as to provide the third base opening portions 73 to the sixth base opening portion 76.

In order to provide the second base insulating layer 65, a varnish of an insulating material having photosensitivity is applied onto the metal supporting board 3, the first base insulating layer 62, and the first electroless plating layer 64 to be dried. Thereafter, the resulting laminate is exposed to light and developed to be then cured by heating. Or, a sheet of an insulating material in which the third base opening portion 73 to the sixth base opening portion 76 are provided in advance is attached onto the metal supporting board 3, the first base insulating layer 62, and the first electroless plating layer 64. Preferably, a varnish of an insulating material having photosensitivity is applied onto the metal supporting board 3, the first base insulating layer 62, and the first electroless plating layer 64 to be dried. Thereafter, the resulting laminate is exposed to light and developed to be then cured by heating.

Each of the third base opening portions 73 provided in this way exposes a part of the first electroless plating layer 64 provided on the surface of the first conductive layer 63, that is, the first electroless plating layer 64 provided in the second concave portion 84 in the front end portion of the first crossing portion 48 and the first electroless plating layer 64 provided in the third concave portion 86 in the rear end portion of the first connecting portion 49. Each of the fourth base opening portions 74 exposes the upper surface of the metal supporting board 3 via the second base opening portion 72. The fifth base opening portion 75 exposes the first electroless plating layer 64 provided in the front end portion of the first crossing portion 48. The sixth base opening portion 76 exposes the first electroless plating layer 64 provided in the left end portion of the third connecting portion 78.

<Step of Providing Second Conductive Layer 66>

((5) One Example of Step of Providing Second Conductive Layer)

Next, in this method, as shown in FIGS. 13A to 13D, the second conductive layer 66 is provided on the second base insulating layer 65 so as to fill the inside of the third base opening portions 73 to the sixth base opening portion 76.

Examples of a method for providing the second conductive layer 66 include an additive method and a subtractive method. Preferably, an additive method is used.

<Step of Providing Second Electroless Plating Layer 67>

((6) One Example of Step of Providing Second Electroless Plating Layer)

Next, in this method, as shown in FIGS. 14A to 14D, the second electroless plating layer 67 is provided on the surfaces (the upper surface and the side surfaces) of the second conductive layer 66.

Figure 14A:
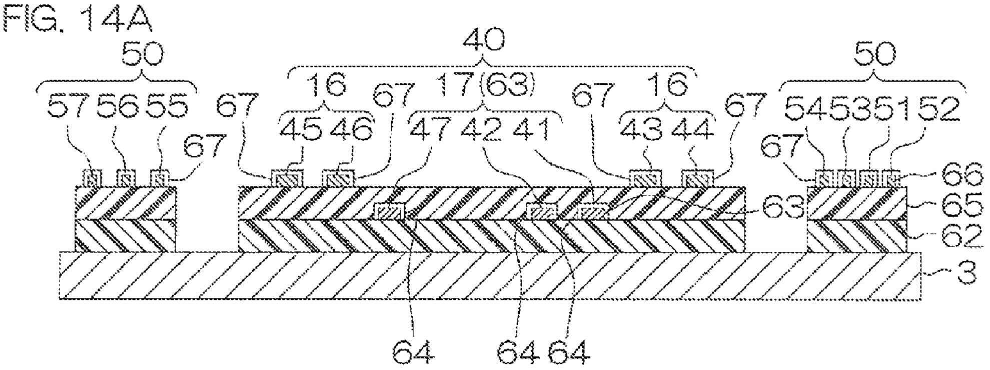
FIGS. 14A to 14D show the steps of providing a second electroless plating layer in the method for producing a suspension board with circuit in FIG. 1 and each of FIGS. 14A to 14D corresponds to each of FIGS. 4 to 7.
Figure 14B:
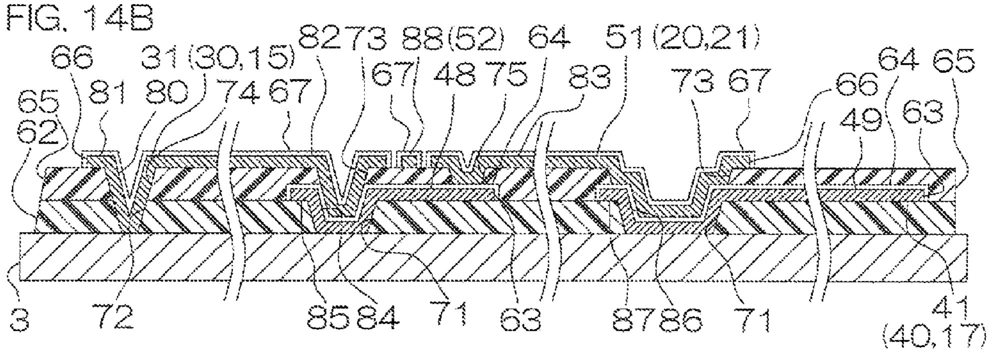
Figure 14C:
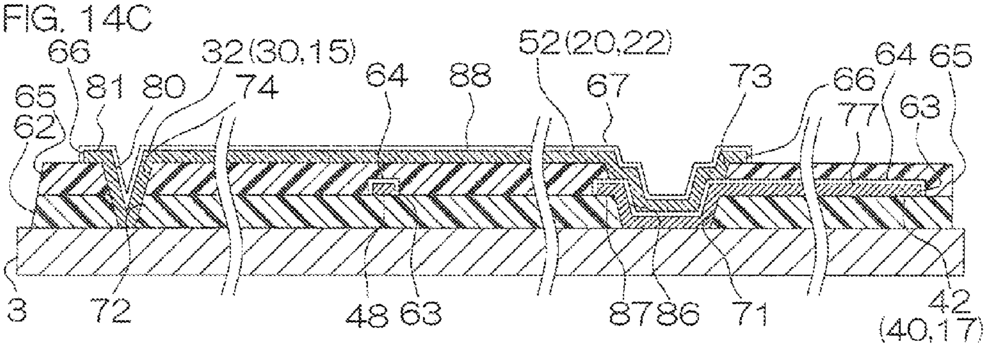
Figure 14D:
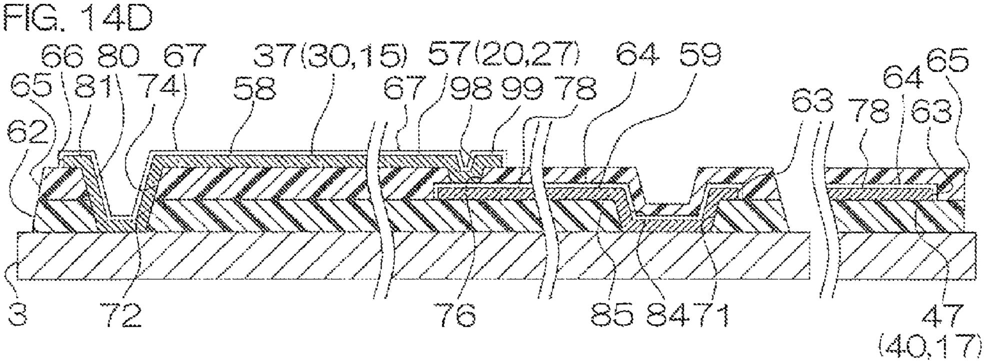
Figure 15A:
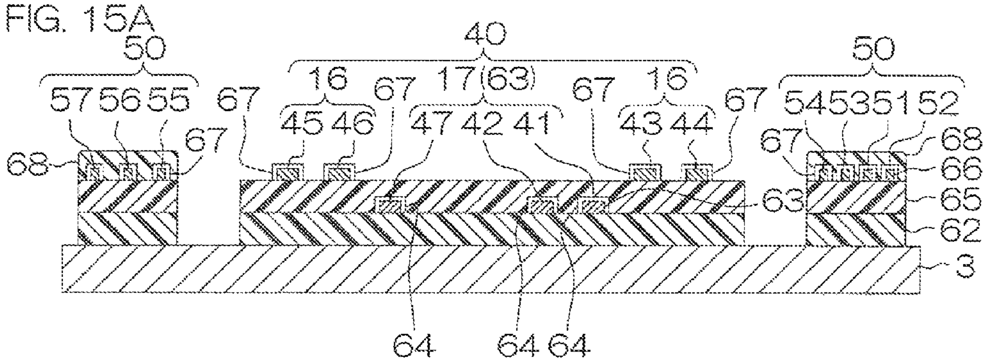
FIGS. 15A to 15D show the steps of providing a cover insulating layer in the method for producing a suspension board with circuit in FIG. 1 and each of FIGS. 15A to 15D corresponds to each of FIGS. 4 to 7.
Figure 15B:
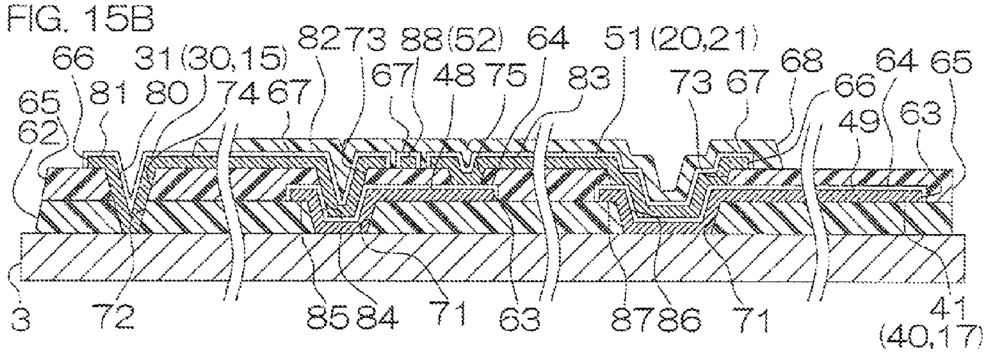
Figure 15C:
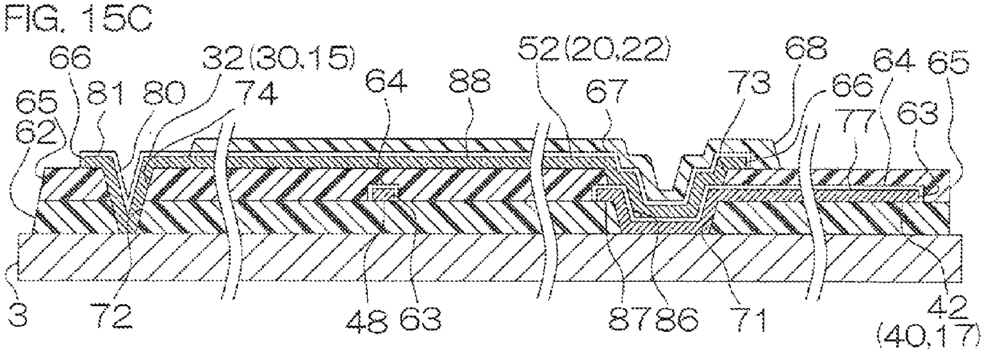
Figure 15D:
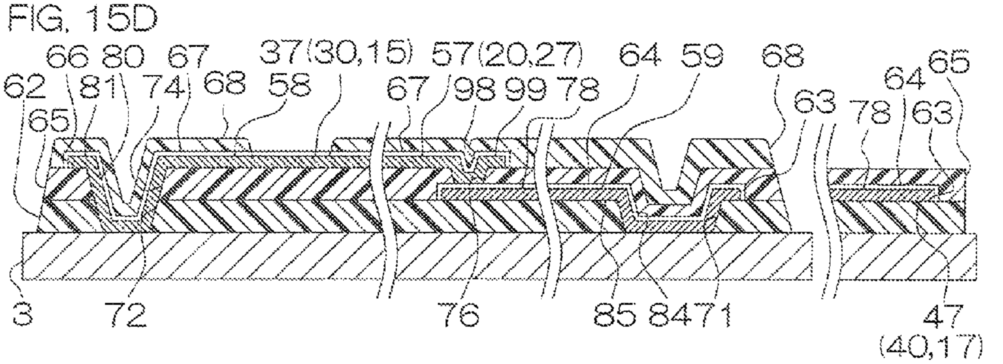
Figures 16A, 16B, 16C, 16D:
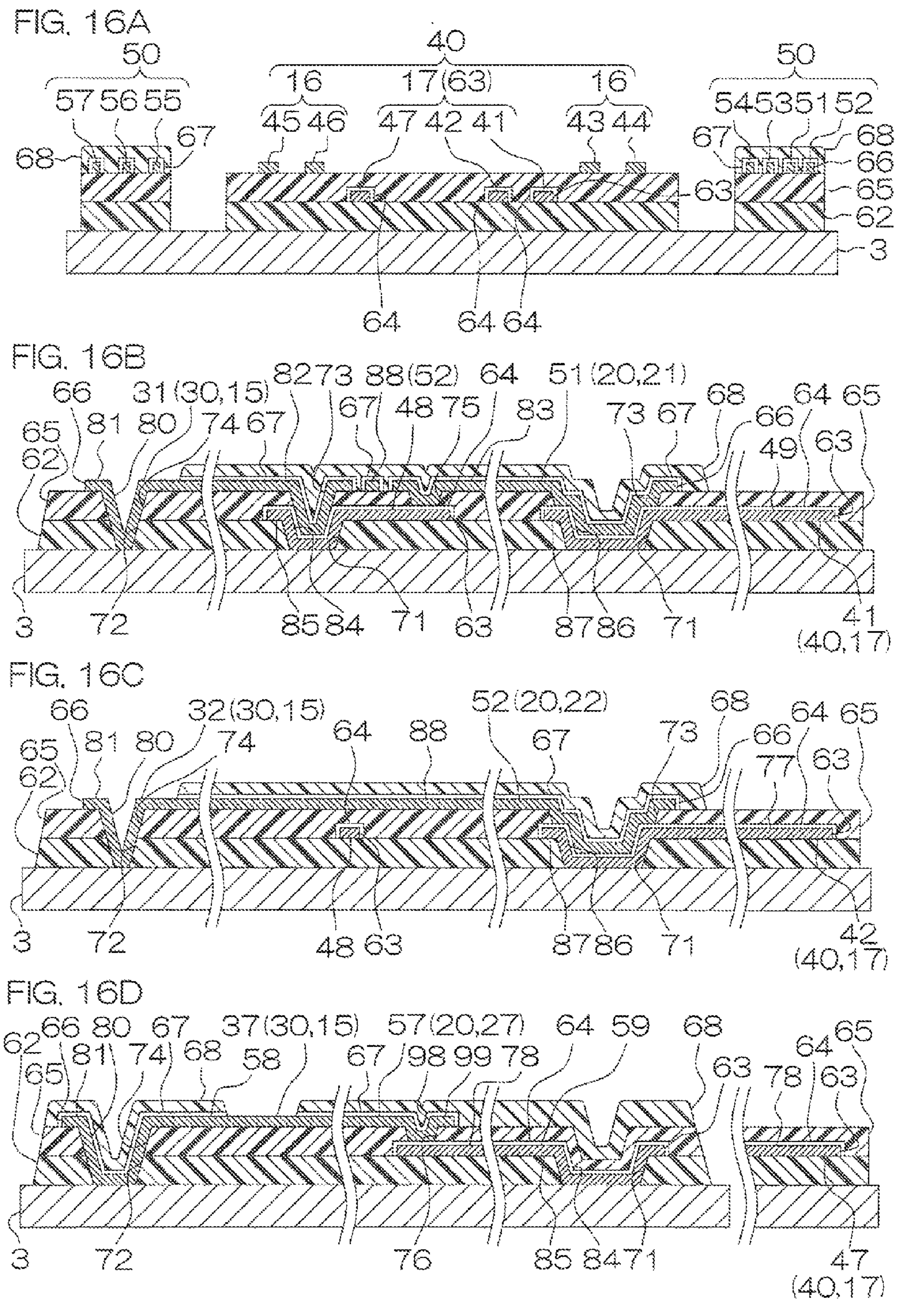
FIGS. 16A to 16D show the steps of removing a second electroless plating layer provided in external-side terminals and slider-side terminals in the method for producing a suspension board with circuit in FIG. 1 and each of FIGS. 16A to 16D corresponds to each of FIGS. 4 to 7.
Figures 17A, 17B, 17C, 17D:
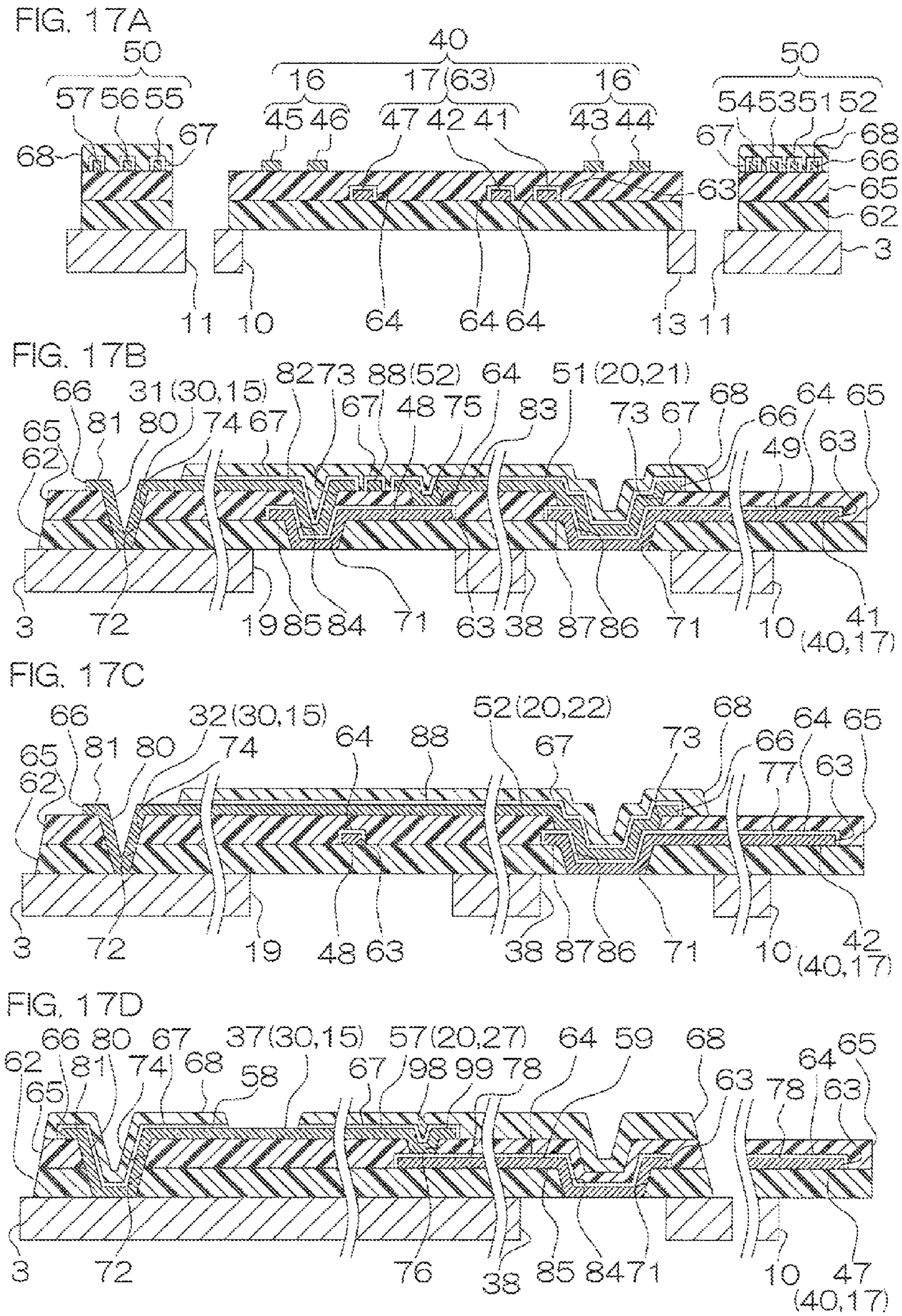
FIGS. 17A to 17D show the steps of removing a metal supporting board in contact with the lower surface of a first conductive layer filling the inside of a first base opening portion in the method for producing a suspension board with circuit in FIG. 1 and each of FIGS. 17A to 17D corresponds to each of FIGS. 4 to 7.
Figures 18A, 18B, 18C, 18D:
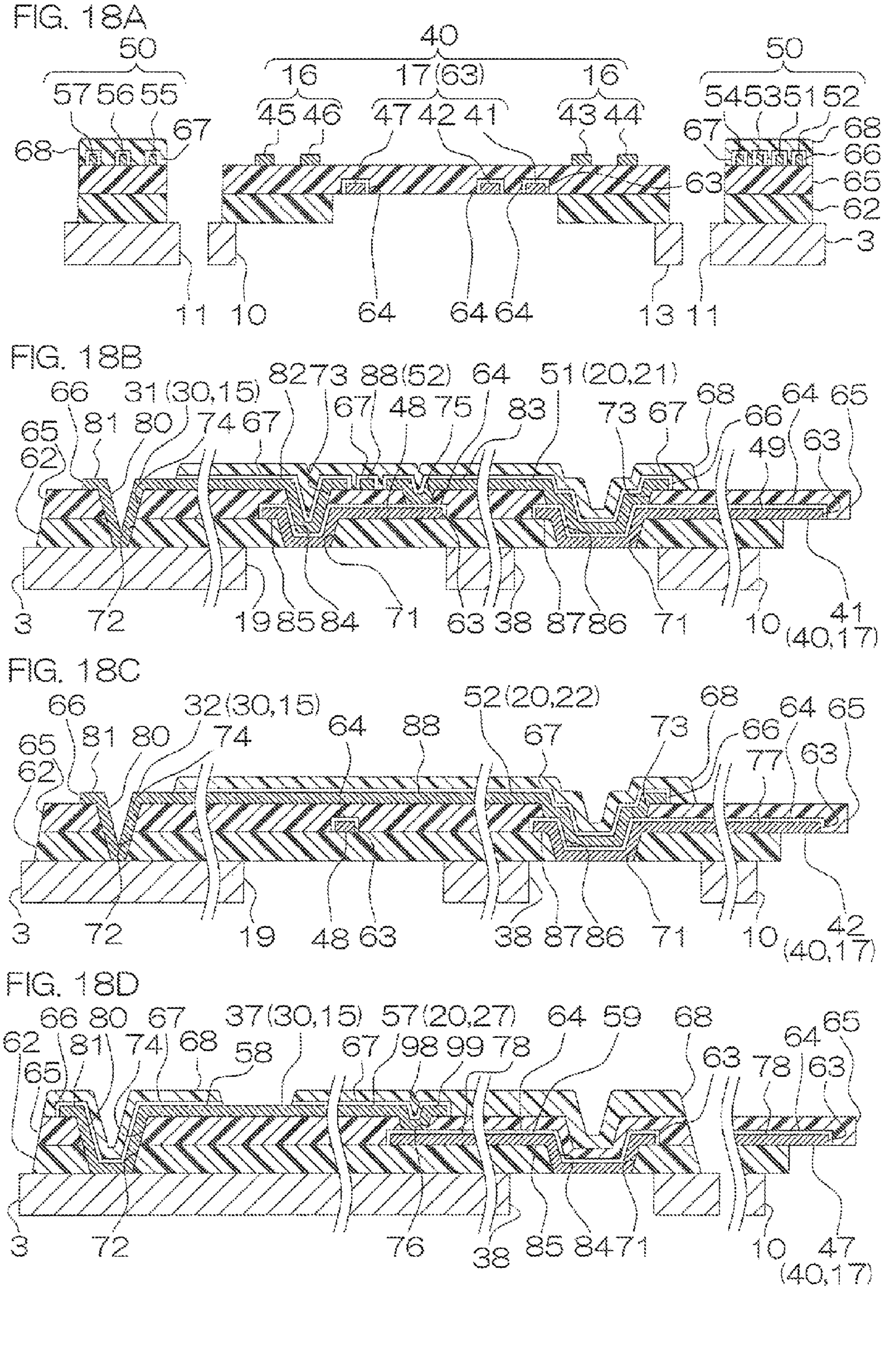
FIGS. 18A to 18D show the steps of removing a first base insulating layer so as to expose the lower surfaces of light emitting-side terminals in the method for producing a suspension board with circuit in FIG. 1 and each of FIGS. 18A to 18D corresponds to each of FIGS. 4 to 7.

The conditions for the electroless plating are the same as those for the electroless plating in the above-described first electroless plating layer 64. Among all, the electroless plating time, that is, the immersion time, is capable of being set to be short. That is, in the first conductive pattern 21, the second conductive pattern 22, and the seventh conductive pattern 27, the second conductive layer 66 fills the inside of the third base opening portions 73 to the sixth base opening portion 76 and in this way, as shown in FIGS. 14B and 14C, in the first base opening portion 71 and the third base opening portion 73, the second conductive layer 66 is electrically connected to the metal supporting board 3 via the first conductive layer 63. Furthermore, as shown in FIGS. 14A to 14C, in the second base opening portion 72 and the fourth base opening portion 74, the second conductive layer 66 is in contact with the upper surface of the metal supporting board 3 and in this way, the second conductive layer 66 is electrically connected to the metal supporting board 3. Thus, the second electroless plating layer 67 on the surface of the second conductive layer 66 is capable of being stably deposited. As a result, on the surface of the metal supporting board 3, attachment of a plating material for constituting the second electroless plating layer 67 is capable of being suppressed. The immersion time depends on the composition of a plating solution, a thickness of the second electroless plating layer 67 to be aimed at, or the like and is, for example, 10 minutes or less, preferably 5 minutes or less, or more preferably 2 minutes or less, and is, for example, 0.1 minutes or more.

<Step of Providing Cover Insulating Layer 68>

Next, in this method, as shown in FIGS. 15A to 15D, the cover insulating layer 68 is provided so as to cover the second electroless plating layers 67 provided in a plurality of the wires 50. The cover insulating layer 68 is also provided so as to expose the second electroless plating layers 67 provided in the external-side terminals 15 and the slider-side terminals 16.

In order to provide the cover insulating layer 68, for example, a varnish of an insulating material having photosensitivity is applied onto the second base insulating layer 65 and the second conductive layer 66 to be dried. Thereafter, the resulting laminate is exposed to light and developed to be then cured by heating. Or, a sheet of an insulating material that is formed into the above-described pattern in advance is attached onto the second base insulating layer 65 and the second conductive layer 66. Preferably, a varnish of an insulating material having photosensitivity is applied onto the second base insulating layer 65 and the second conductive layer 66 to be dried. Thereafter, the resulting laminate is exposed to light and developed to be then cured by heating.

<Step of Removing Second Electroless Plating Layer 67>

((7) One Example of Step of Removing Second Electroless Plating Layer by Etching)

Next, in this method, as shown in FIGS. 16A to 16D, the second electroless plating layer 67 provided in the external-side terminals 15 and the slider-side terminals 16 is removed.

In order to remove the above-described second electroless plating layer 67, for example, a wet method or a dry method such as plasma treatment and laser radiation treatment is used. Preferably, a wet method is used. As the wet method, for example, etching (wet etching) or the like using an etching solution and an etching resist is used. To be specific, in the etching, first, the etching resist is provided on a portion, other than a portion that is intended to be removed, in the surface of the second electroless plating layer 67 and next, the laminate on which the etching resist is provided is immersed into an etching solution and a portion that is intended to be removed in the second electroless plating layer 67 is removed. Thereafter, the etching resist is removed.

The etching resist is, for example, provided so as to expose the surface of the metal supporting board 3. In this way, a plating material that may be attached to the surface of the metal supporting board 3 for constituting the first electroless plating layer 64 and the second electroless plating layer 67 is capable of being removed. The attachment of a plating material for constituting the first electroless plating layer 64 and the second electroless plating layer 67 to the metal supporting board 3 is suppressed, so that the etching time (the immersion time into the etching solution) is capable of being set to be short. The etching time depends on the composition of an etching solution, a thickness of the second electroless plating layer 67 that is removed, or the like and is, for example, 5 minutes or less, preferably 2 minutes or less, or more preferably 1 minute or less, and is, for example, 0.1 minutes or more.

<Step of Removing Metal Supporting Board 3 in Contact with Lower Surface of First Conductive Layer 63 Filling Inside of First Base Opening Portion 71>

((8) One Example of Step of Removing Metal Supporting Board in Contact with Lower Surface of First Conductive Layer Filling Inside of First Opening Portion)

Next, in this method, as shown in FIGS. 17A to 17D, the metal supporting board 3 in contact with the lower surface of the first conductive layer 63 filling the inside of the first base opening portion 71 is removed.

To be specific, the terminal opening portion 10, the slit 11, the second support opening portion 19, and the third support opening portion 38 are formed in the metal supporting board 3.

Examples of a method for removing the above-described metal supporting board 3 include etching and laser processing.

In this way, the first base insulating layer 62 is exposed downwardly from the second support opening portion 19 and the third support opening portion 38.

<Step of Removing First Base Insulating Layer 62 to Expose Lower Surface of Light Emitting-Side Terminal 17>

Next, in this method, as shown in FIGS. 18A to 18D, the first base insulating layer 62 is removed so as to expose the lower surfaces of the light emitting-side terminals 17. Examples of a method for removing the first base insulating layer 62 include etching and laser processing.

<Step of Providing Electrolytic Plating Layer 69>

((9) One Example of Step of Providing Electrolytic Plating Layer)

Figures 19A, 19B, 19C, 19D:
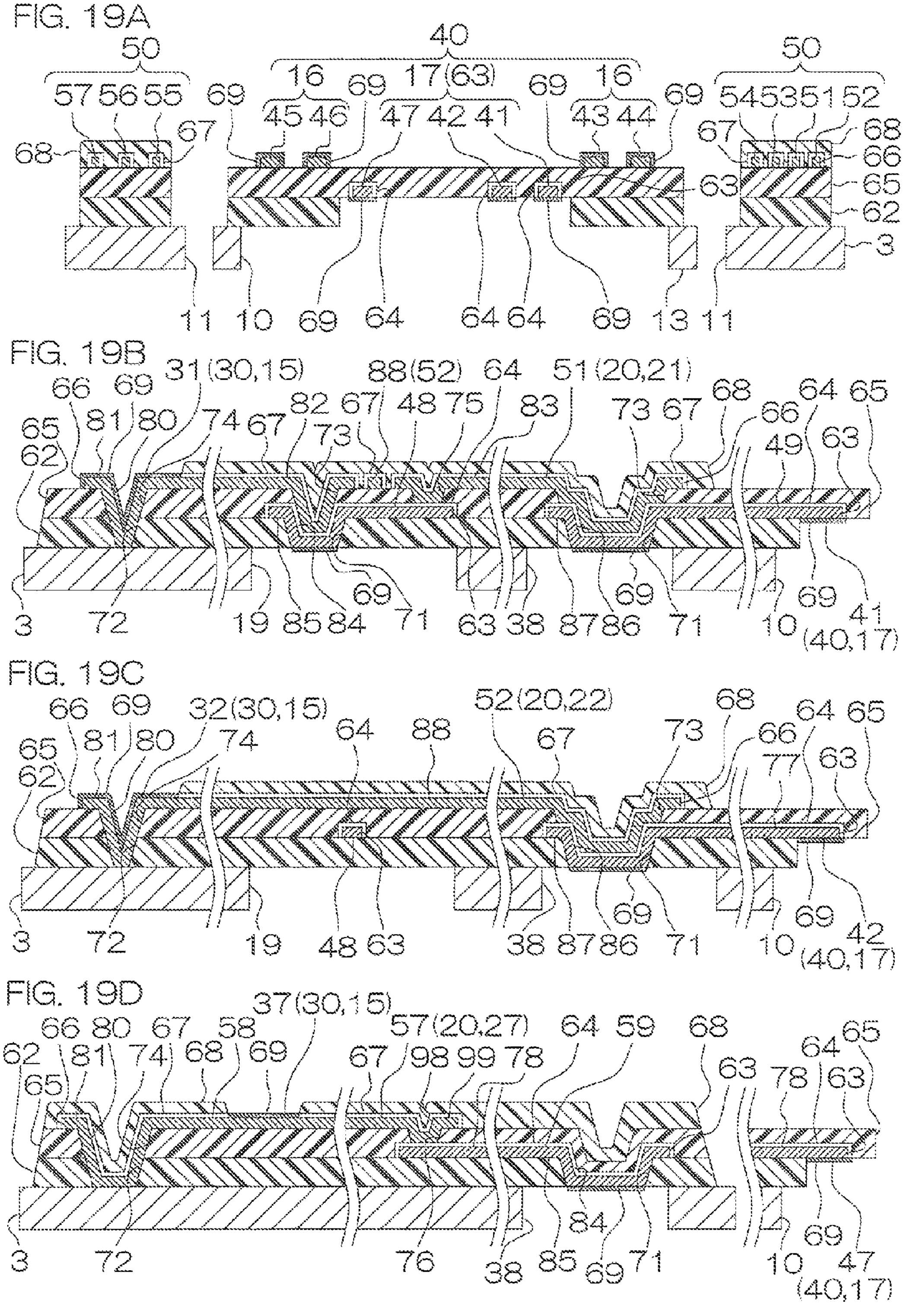
FIGS. 19A to 19D show the steps of providing an electrolytic plating layer in the method for producing a suspension board with circuit in FIG. 1 and each of FIGS. 19A to 19D corresponds to each of FIGS. 4 to 7.

Next, in this method, as shown in FIGS. 19A to 19D, the electrolytic plating layer 69 is provided on the back surfaces (the lower surfaces, ref: FIGS. 19A to 19D) of the light emitting-side terminals 17; the surfaces (the upper surfaces and the side surfaces, that is, the surfaces of the light emitting-side terminals 17 from which the second electroless plating layer 67 is removed, ref: FIG. 19A) of the slider-side terminals 16; the surfaces (the upper surfaces and the side surfaces, that is, the surfaces of the external-side terminals 15 from which the second electroless plating layer 67 is removed, ref: FIGS. 19A to 19D) of the external-side terminals 15; the back surface (the lower surface, ref: FIGS. 19B and 19C) of the first conductive layer 63 that is exposed from the second support opening portion 19 and the first base opening portion 71; and the back surface (the lower surface, ref: FIGS. 19B to 19D) of the first conductive layer 63 that is exposed from the support opening portion 38 and the first base opening portion 71 by electrolytic plating that supplies electricity from the metal supporting board 3.

The conditions for the electrolytic plating are not particularly limited. The second conductive layer 66 that fills the second base opening portion 72 is in contact with the metal supporting board 3, so that the metal supporting board 3 is electrically connected to a plurality of the conductive patterns 20. Thus, the electrolytic plating layer 69 is laminated on the top surface and the back surface of each of the above-described layers by supplying electricity to the metal supporting board 3.

<Step of Insulating Metal Supporting Board 3 in Contact with Lower Surface of Second Conductive Layer 66 Filling Inside of Second Base Opening Portion 72 from Surrounding Metal Supporting Board 3>

((10) One Example of Step of Insulating Metal Supporting Board in Contact with Lower Surface of Second Conductive Layer Filling Inside of Second Opening Portion from Surrounding Metal Supporting Board)

Next, in this method, as shown in FIGS. 20A to 20D, the metal supporting board 3 that is in contact with the lower surface of the second conductive layer 66 that fills the inside of the second base opening portion 72 is insulated from the surrounding metal supporting board 3.

Figure 20A:
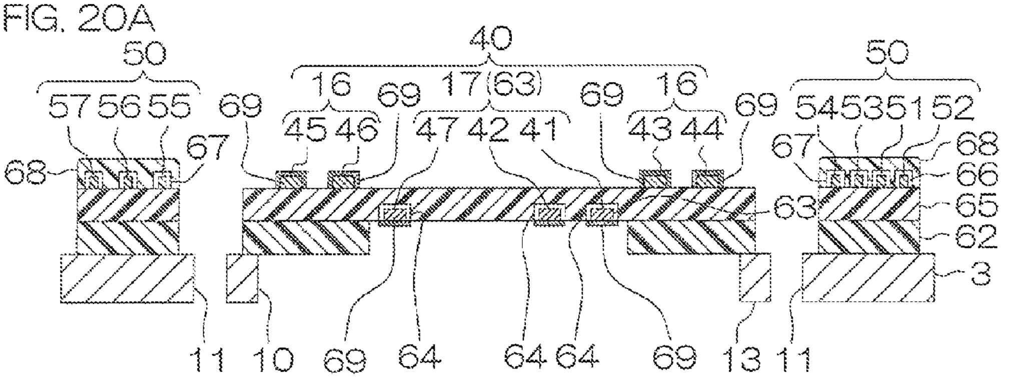
FIGS. 20A to 20D show a step of insulating a metal supporting board in contact with the lower surface of a second conductive layer filling the inside of a second base opening portion from the surrounding metal supporting board in the method for producing a suspension board with circuit in FIG. 1.
Figure 20B:
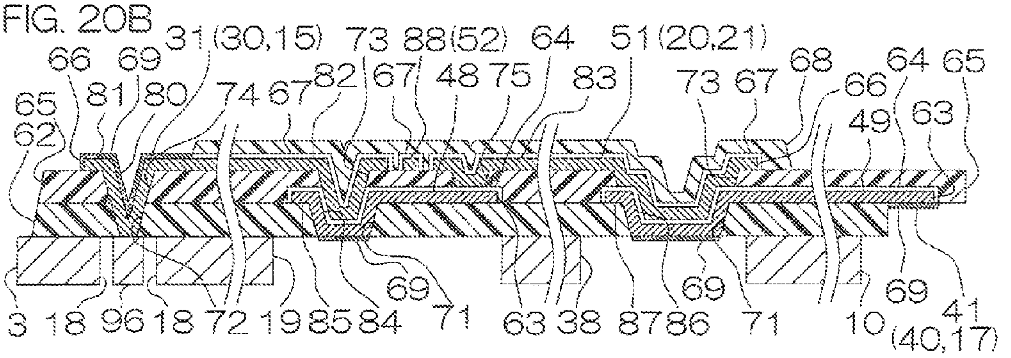
Figure 20C:
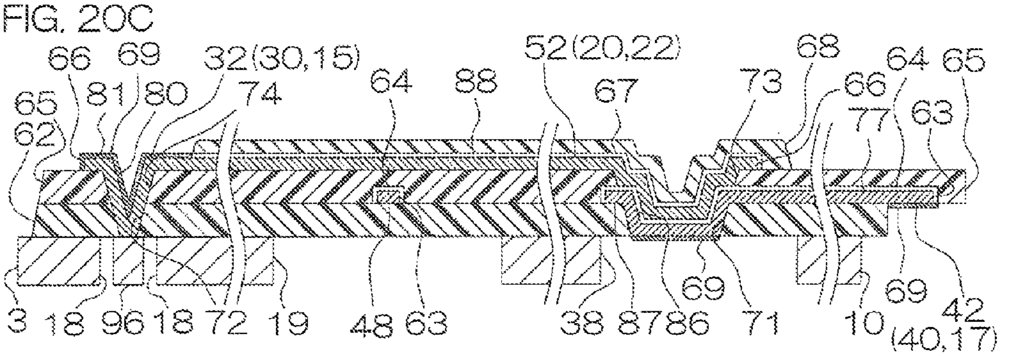
Figure 20D:
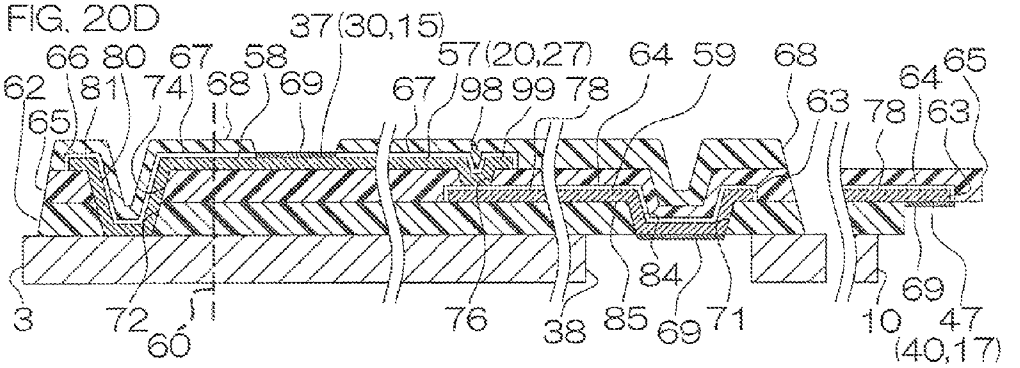

To be specific, as shown in FIGS. 20B and 20C, the first support opening portion 18 is formed in the metal supporting board 3 so as to form a plurality of the terminal support portions 96 that are independent with each other. At the same time with this, as shown in FIG. 20D, the metal supporting board 3 is cut along a cutting line 60 that divides the auxiliary wire 58 and in this way, the metal supporting board 3 in the suspension board with circuit 1 is cut from the frame 7.

As a method for processing the metal supporting board 3, for example, a wet method or a dry method such as plasma treatment and laser radiation treatment is used.

In this way, the terminal support portion 96 is formed at the inside of the first support opening portion 18 and thus, the terminal support portion 96 is insulated from the metal supporting board 3 that surrounds the first support opening portion 18.

In this manner, the suspension board with circuit 1 is obtained.

Thereafter, as shown in FIGS. 5 and 7, the power source 29 and an external circuit board (not shown) are mounted on the main body portion 5 in the suspension board with circuit 1 and as shown in FIG. 4, the slider 2 and the light emitting element 39 are mounted on the gimbal portion 6. To be specific, as shown in FIGS. 5 to 7, the terminals of the power source 29 and the external circuit board (not shown) are electrically connected to the external-side terminals 15; as shown in FIG. 4, the slider 2 is electrically connected to the slider-side terminals 16; and furthermore, the light emitting element 39 is electrically connected to the light emitting-side terminals 17. Thereafter, the suspension board with circuit 1 on which the power source 29, the external circuit board (not shown), the slider 2, and the light emitting element 39 are mounted is mounted on a hard disk drive.

[Function and Effect of Embodiment]

According to this method, as shown in FIGS, 10B to 10D, (2) the first conductive layer 63 including the light emitting-side terminals 17 is provided on the first base insulating layer 62 so as to fill the inside of the first base opening portions 71, so that the first conductive layer 63 is capable of being electrically connected to the metal supporting board 3 via the first base opening portions 71.

Also, as shown in FIGS. 13B to 13D, (5) the second conductive layer 66 including the rear-side terminals 30 is provided on the second base insulating layer 65 so as to fill the inside of the third base opening portions 73, so that the second conductive layer 66 is capable of being electrically connected to the metal supporting board 3 via the third base opening portions 73 and the first base opening portions 71.

Thus, by etching for a relatively short time, a plating material for constituting the second electroless plating layer 67 corresponding to the rear-side terminals 30 and furthermore, the first electroless plating layer 64 and the second electroless plating layer 67 depositing on the metal supporting board 3 is capable of being surely removed.

As a result, over-etching of the rear-side terminals 30 is capable of being prevented, so that a reduction in the connection reliability of the rear-side terminals 30 is capable of being prevented.

According to this method, in the first conductive pattern 21 and the second conductive pattern 22, as shown in FIGS. 19A to 19D, (9) the electrolytic plating layer 69 is provided on the surfaces of the rear-side terminals 30 from which the second electroless plating layer 67 is removed and the lower surface of the first conductive layer 63 that is exposed from the inside of the first base opening portions 71 by electrolytic plating that supplies electricity from the metal supporting board 3, so that the electrolytic plating layer 69 is capable of being provided on the surfaces of the rear-side terminals 30 from which the second electroless plating layer 67 is removed and the lower surface of the first conductive layer 63 that is exposed from the inside of the first base opening portions 71 to be protected without separately providing a plating lead.

Additionally, in the suspension board with circuit 1 obtained by this method, each of the first conductive layer 63 and the second conductive layer 66 is provided in each of the first base insulating layer 62 and the second base insulating layer 65, so that a degree of freedom in the design of the first conductive layer 63 and the second conductive layer 66 is capable of being improved.

According to this method, as shown in FIGS. 12A to 12D, (4) in the step of forming the second base insulating layer 65, the fourth base opening portions 74 are formed in the second base insulating layer 65 so as to communicate with the second base opening portions 72 and as shown in FIGS. 13A to 13D, (5) in the step of providing the second conductive layer 66, the second conductive layer 66 is provided on the second base insulating layer 65 so as to fill the inside of the second base opening portions 72, the third base opening portions 73, and the fourth base opening portions 74, so that the second conductive layer 66 is capable of being electrically connected to the metal supporting board 3 via the second base opening portions 72 and the fourth base opening portions 74.

Thus, as shown in FIGS. 19A to 19D, the electrolytic plating layer 69 is capable of being further more surely provided on the surfaces of the rear-side terminals 30, furthermore, the back surfaces of the light emitting-side terminals 17, and the lower surface of the first conductive layer 63 that is exposed from the inside of the first base opening portions 71 by electrolytic plating that supplies electricity from the metal supporting board 3.

According to this method, the metal supporting board 3 in contact with the lower surface of the second conductive layer 66 filling the inside of the second base opening portions 72 is insulated from the surrounding metal supporting board 3, so that the second conductive layer 66 is capable of being used for various uses, to be specific, used as a differential layer or a power source layer (to be more specific, a power source layer in the first conductive pattern 21, the second conductive pattern 22, and the seventh conductive pattern 27).

According to this method, in the step of providing the second base insulating layer 65, the third base opening portions 73 that are filled with the first conductive pattern 21 and the second conductive pattern 22 are, when projected in the thickness direction, disposed at the same position as that of the first base opening portions 71, so that space saving of the first base opening portions 71 and the third base opening portions 73 is capable of being achieved.

On the other hand, according to this method, as shown in FIG. 12D, (4) in the step of providing the second base insulating layer 65, the sixth base opening portion 76 that is filled with the seventh conductive pattern 27 is, when projected in the thickness direction, disposed at a position different from that of the first base opening portions 71, so that a degree of freedom in the design of the first base opening portions 71 and the sixth base opening portion 76 is capable of being improved.

According to this method, as shown in FIGS. 1 to 3, one pair of the third support opening portions 38 are symmetrically disposed with respect to the reference line V along the longitudinal direction, so that a balance of both sides in the right-left direction of the reference line V in the obtained suspension board with circuit 1 is capable of being further more improved.

Furthermore, in this method, the metal supporting board 3 is made of stainless steel and the attachment of nickel particles made of nickel for constituting the first electroless plating layer 64 and the second electroless plating layer 67 to the metal supporting board 3 is capable of being effectively suppressed.

<Modified Example>

In the above-described embodiment, as shown in FIGS. 7 and 13D, in the seventh conductive pattern 27, the auxiliary wire 58 included in the second conductive layer 66 is provided on the second base insulating layer 65. Alternatively, for example, as shown in FIG. 21, the auxiliary wire 58 included in the second conductive layer 66 is also capable of being provided on both the first base insulating layer 62 and the second base insulating layer 65.

Figure 21:
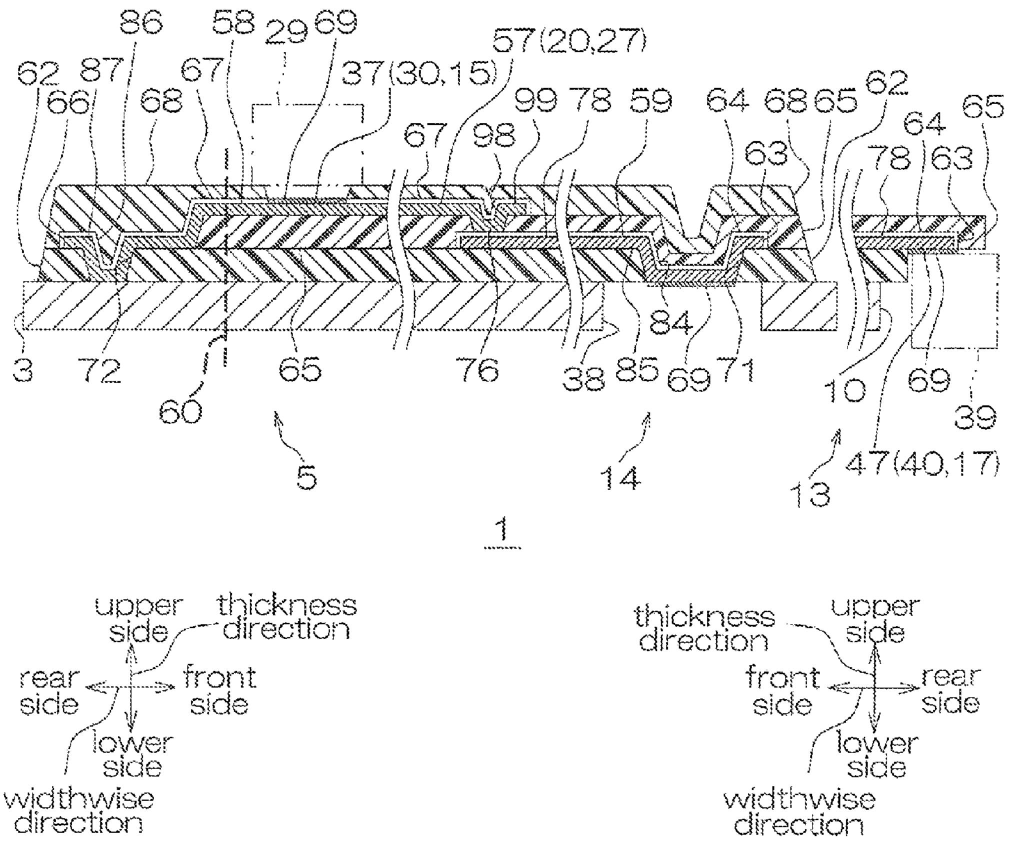
FIG. 21 shows a sectional view along a seventh conductive pattern of a modified example of the suspension board with circuit shown in FIG. 7.

As shown in FIG. 21, the rear end edge of the second base insulating layer 65 corresponding to the auxiliary wire 58 is disposed at spaced intervals to the front side of the second base opening portion 72. The auxiliary wire 58 in the seventh conductive pattern 27 extends toward the rear side on the upper surface of the second base insulating layer 65, descends downwardly along the rear end surface of the second base insulating layer 65, subsequently reaches the upper surface of the first base insulating layer 62, thereafter, further extends toward the rear side, and finally fills the inside of the second base opening portion 72.

In this Modified Example, the second base insulating layer 65 corresponding to the seventh conductive pattern 27 is provided without providing the fourth base opening portion 74.

Figure 8A:
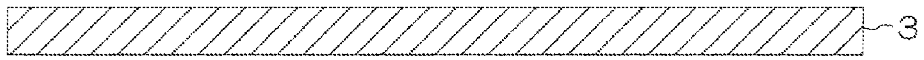
FIGS. 8A to 8D show the steps of preparing a metal supporting board in the method for producing a suspension board with circuit in FIG. 1 and each of FIGS. 8A to 8D corresponds to each of FIGS. 4 to 7.
Figure 8B:
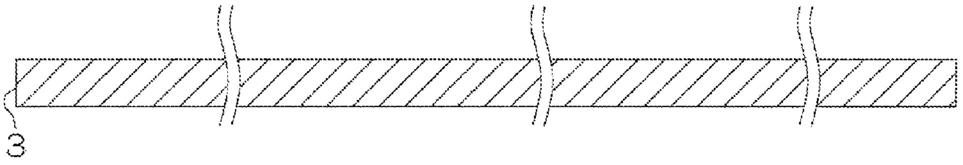
Figure 8C:
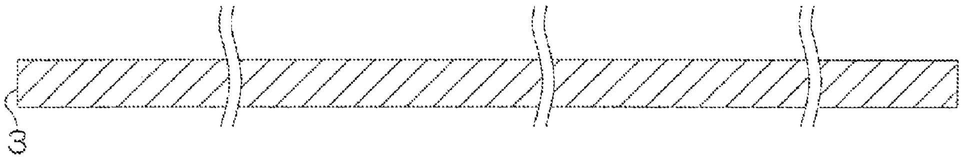
Figure 8D:
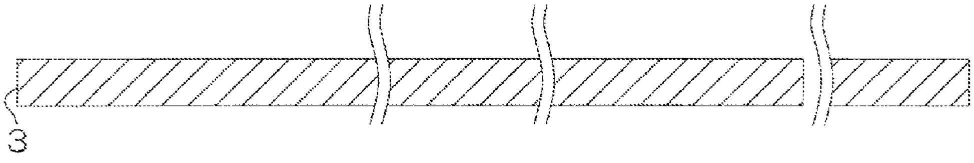
Figure 9A:
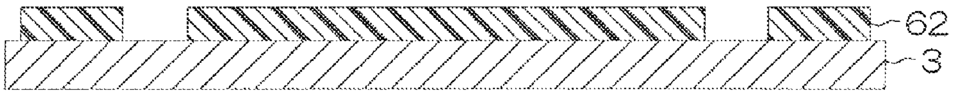
FIGS. 9A to 9D show the steps of providing a first base insulating layer in the method for producing a suspension board with circuit in FIG. 1 and each of FIGS. 9A to 9D corresponds to each of FIGS. 4 to 7.
Figure 9B:
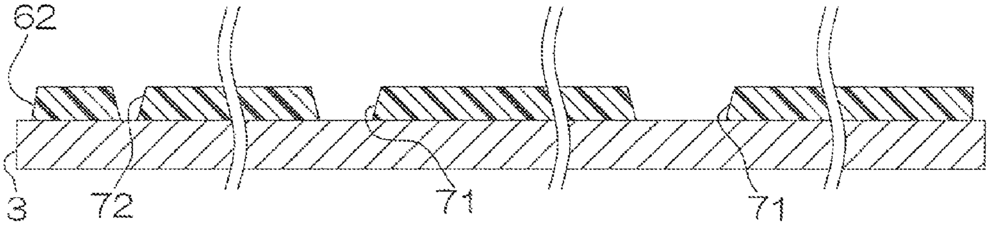
Figure 9C:
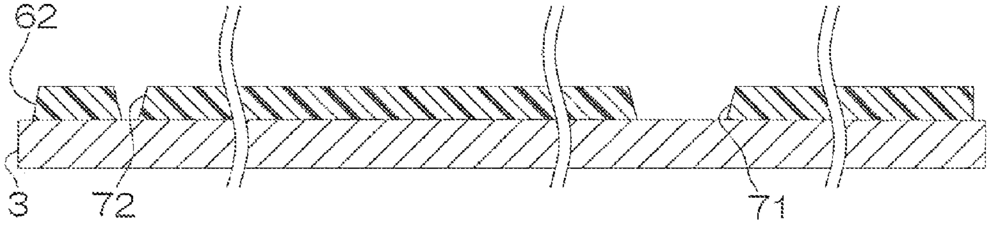
Figure 9D:
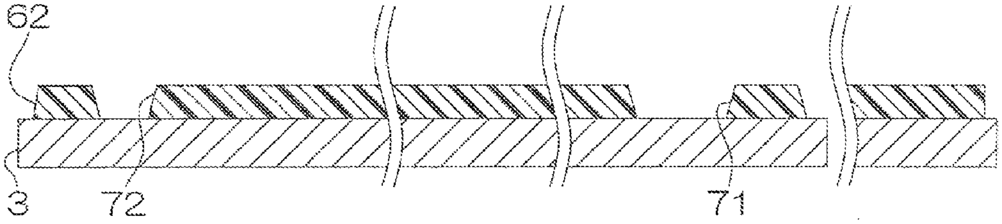
Figure 11A:
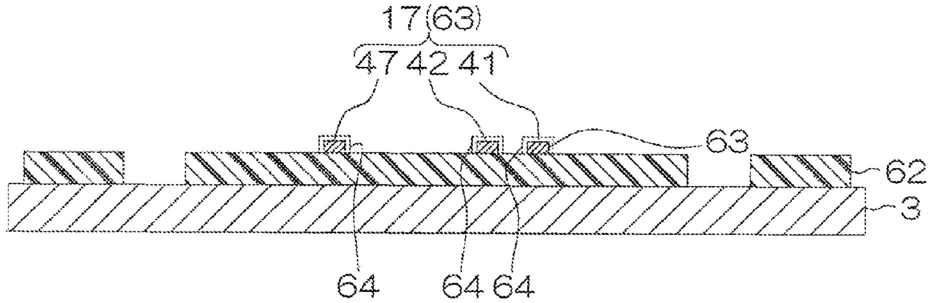
FIGS. 11A to 11D show the steps of providing a first electroless plating layer in the method for producing a suspension board with circuit in FIG. 1 and each of FIGS. 11A to 11D corresponds to each of FIGS. 4 to 7.
Figure 11B:
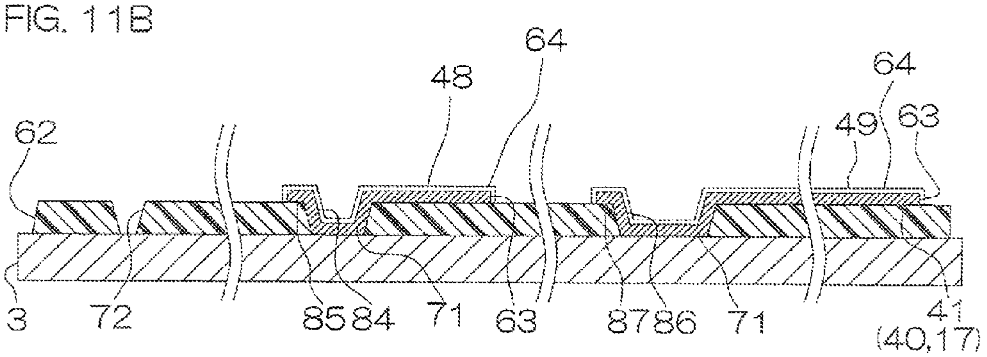
Figure 11C:
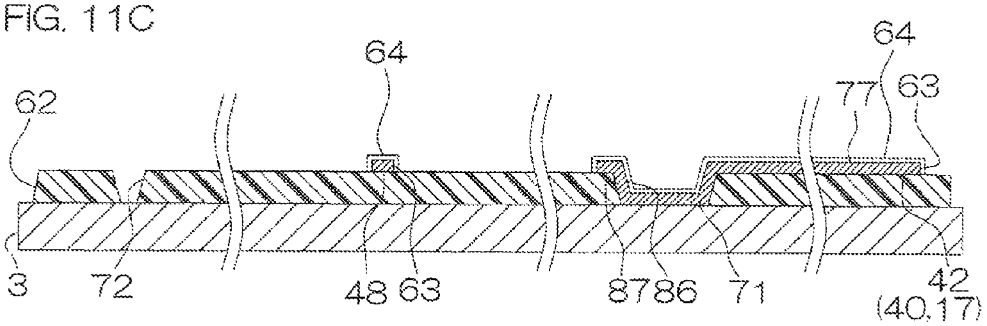
Figure 11D:
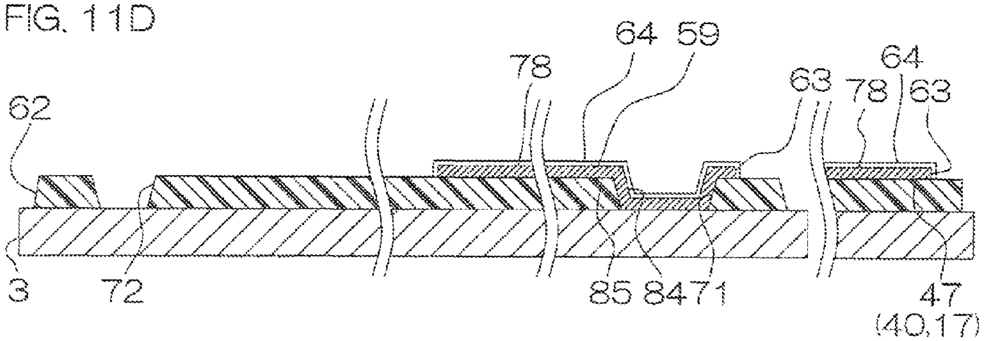

In the method for obtaining the suspension board with circuit 1, as shown in FIGS. 8D to 11D, the metal supporting board 3 is prepared (ref: FIG. 8D) and subsequently, the first base insulating layer 62 (ref: FIG. 9D), the first conductive layer 63 (ref: FIG. 10D), and the first electroless plating layer 64 (ref: FIG. 11D) are sequentially provided by the same method as that described above.

Figure 22A:
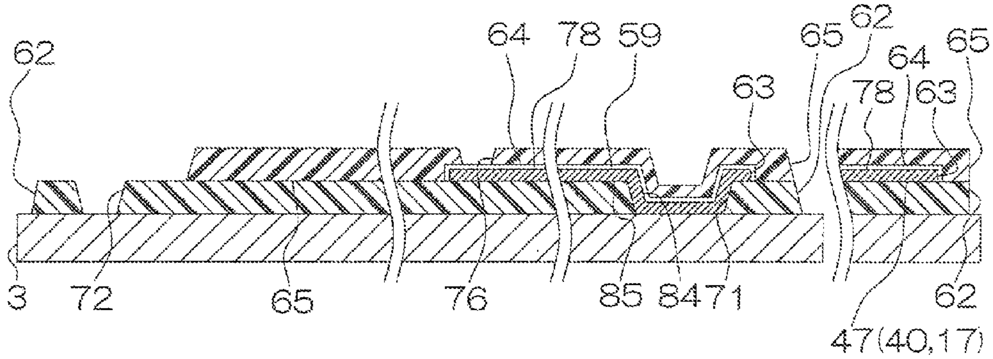
FIGS. 22A to 22C show process drawings for producing a modified example of the suspension board with circuit shown in FIG. 21.

Thereafter, in this method, as shown in FIG. 22A, the second base insulating layer 65 is provided on the first base insulating layer 62 without providing the fourth base opening portion 74 (ref: FIG. 12D).

Figure 22B:
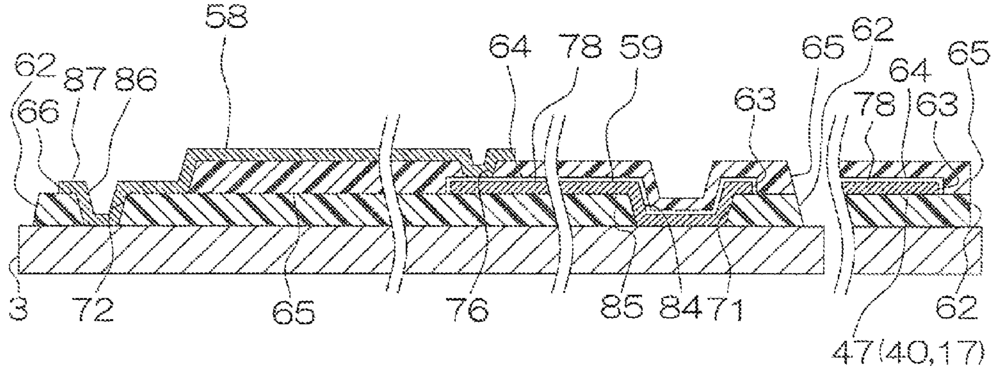

Next, in this method, as shown in FIG. 22B, the second conductive layer 66 is provided on the first base insulating layer 62 and the second base insulating layer 65. To be specific, the second electroless plating layer 67 is provided so as to fill the second base opening portion 72 in the first base insulating layer 62 and the sixth base opening portion 76 in the second base insulating layer 65. The second conductive layer 66 filling the second base opening portion 72 is laminated on the upper surface of the metal supporting board 3 that is exposed from the second base opening portion 72. On the other hand, the second conductive layer 66 filling the sixth base opening portion 76 is laminated on the upper surface of the first electroless plating layer 64 that is exposed from the sixth base opening portion 76.

Figure 22C:
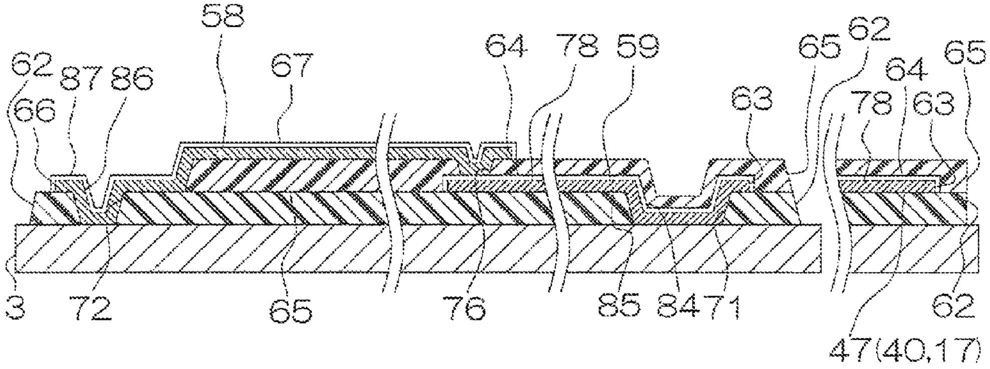

Next, in this method, as shown in FIG. 22C, the second electroless plating layer 67 is provided on the surface of the second conductive layer 66.

Figure 23D:
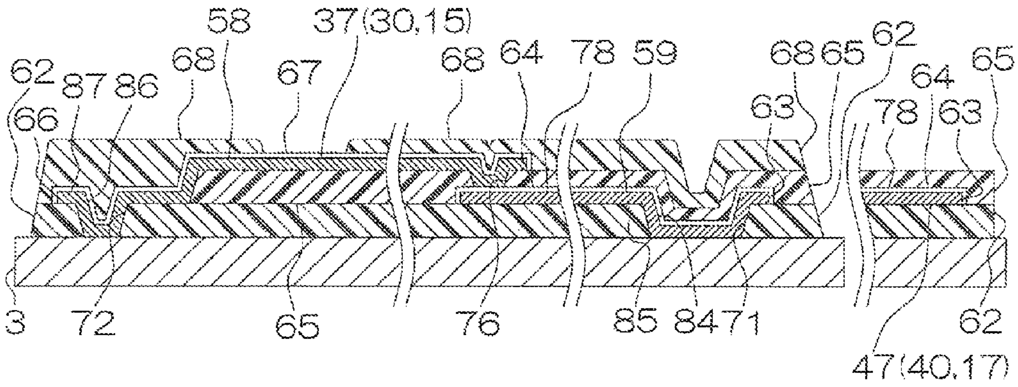
FIGS. 23D to 23F, subsequent to FIG. 22C, show process drawings for producing a modified example of the suspension board with circuit shown in FIG. 21.

Next, in this method, as shown in FIG. 23D, the cover insulating layer 68 is provided on the first base insulating layer 62 and the second base insulating layer 65 so as to cover the second electroless plating layer 67.

Figure 23E:
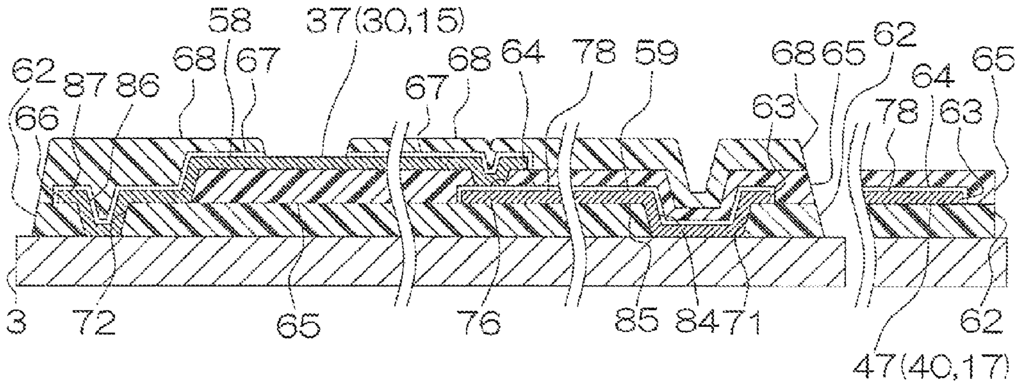

Next, in this method, as shown in FIG. 23E, the second electroless plating layer 67 that is exposed from the cover insulating layer 68 is removed by etching.

Figure 23F:
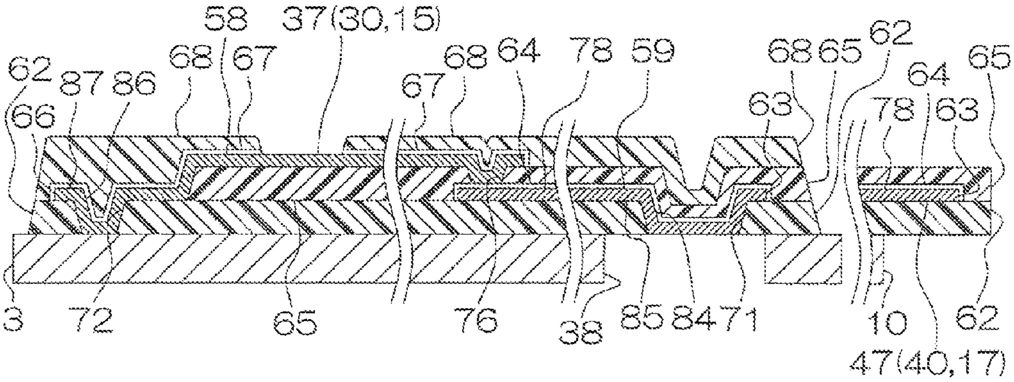

Next, in this method, as shown in FIG. 23F, the metal supporting board 3 that is in contact with the lower surface of the first conductive layer 63 filling the inside of the first base opening portion 71 is removed.

Figure 24G:
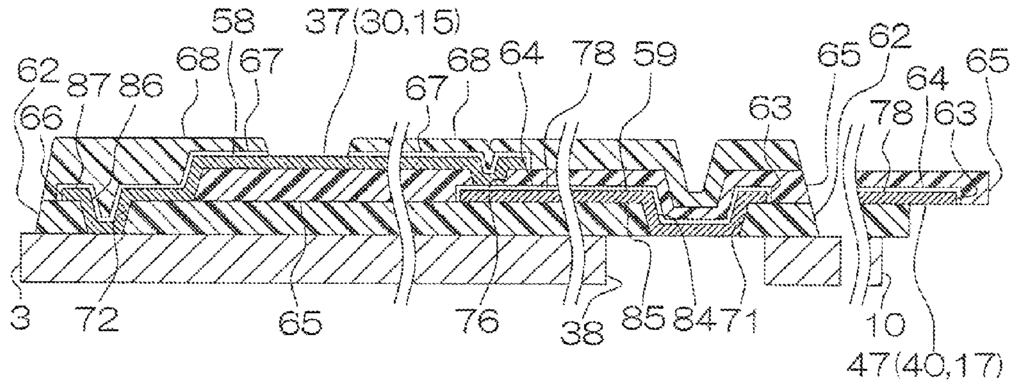
FIGS. 24G to 24I, subsequent to FIG. 23F, show process drawings for producing a modified example of the suspension board with circuit shown in FIG. 21.

Next, in this method, as shown in FIG. 24G, the first base insulating layer 62 is removed so as to expose the lower surface of the light emitting-side terminal 17.

Figure 24H:
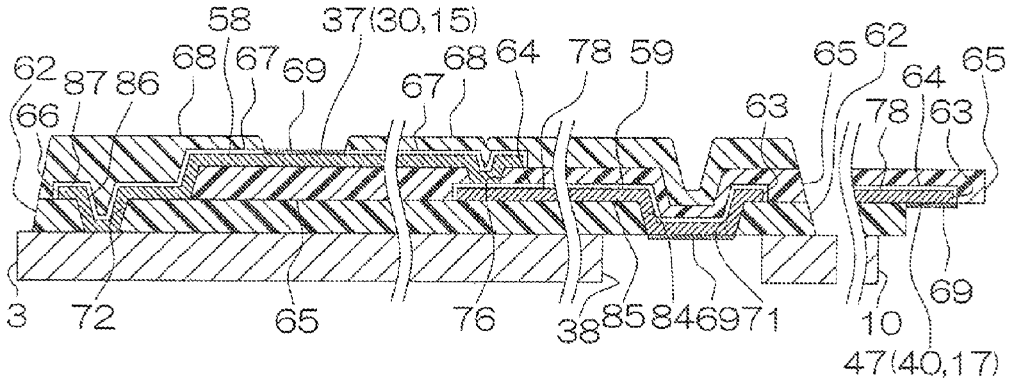
Figure 24:
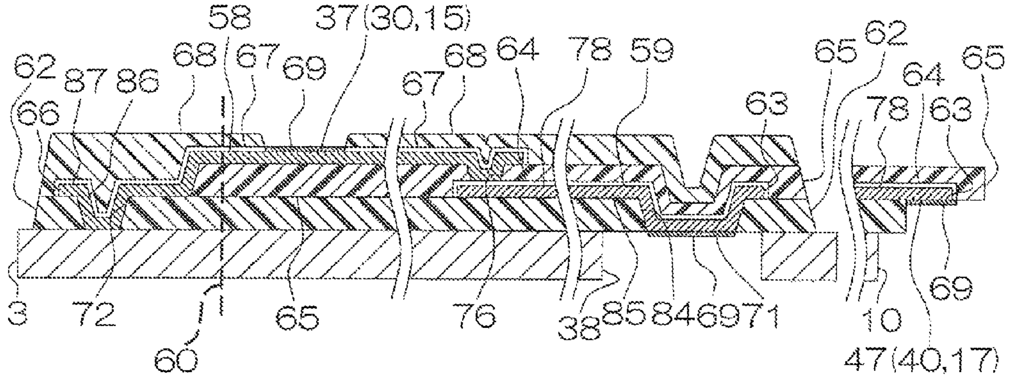

Next, in this method, as shown in FIG. 24H, the electrolytic plating layer 69 is provided on the back surface of the light emitting-side terminal 17, the surfaces of the slider-side terminals 16 (ref: FIG. 19A), the surfaces of the external-side terminals 15, and the back surface of the first conductive layer 63 that is exposed from the first base opening portion 71 by electrolytic plating that supplies electricity from the metal supporting board 3.

Thereafter, in this method, as shown in FIG. 24I, the metal supporting board 3 in contact with the lower surface of the second conductive layer 66 filling the inside of the second base opening portion 72 is insulated from the surrounding metal supporting board 3.

In this method, as shown in FIG. 22B, (5) the second conductive layer 66 including the rear-side terminals 30 is provided on the second base insulating layer 65 and the first base insulating layer 62 so as to fill the second base opening portions 72 and the sixth base opening portion 76, so that the second conductive layer 66 is capable of being electrically connected to the metal supporting board 3 via the second base opening portions 72.

Furthermore, in FIG. 4, the light emitting-side terminals 17 are provided so as to be embedded in the second base insulating layer 65. Alternatively, for example, though not shown, as long as the light emitting-side terminals 17 are on the first base insulating layer 62, when projected in a direction perpendicular to the thickness direction (the front-rear direction or the widthwise direction), the light emitting-side terminals 17 are, for example, also capable of being provided on the upper surface of the first base insulating layer 62.

In such a case, though not shown, the first electroless plating layer 64 is also provided on the surfaces (the upper surfaces and the side surfaces) of the light emitting-side terminals 17 and subsequently, as referred in FIGS. 12A to 12D, the second base insulating layer 65 is provided so as to expose the first electroless plating layers 64 of the light emitting-side terminals 17. Subsequently, as referred in FIGS. 13A to 13D and 14A to 14D, the second conductive layer 66 and the second electroless plating layer 67 are provided. Thereafter, as referred in FIGS. 15A to 15D, the cover insulating layer 68 is provided so as to expose the first electroless plating layers 64 of the light emitting-side terminals 17 and as referred in FIGS. 16A to 16D, along with the second electroless plating layers 67 of the slider-side terminals 16 and the external-side terminals 15, the first electroless plating layers 64 of the light emitting-side terminals 17 are removed by etching. Thereafter, as referred in FIGS. 17A to 17D, the metal supporting board 3 in contact with the lower surface of the first conductive layer 63 filling the inside of the first base opening portion 71 is removed. Subsequently, as referred in FIGS. 18A to 18D, the first base insulating layer 62 is removed. Thereafter, as referred in FIGS. 19A to 19D, the electrolytic plating layer 69 is provided on the surfaces of the slider-side terminals 16, the light emitting-side terminals 17, and the rear-side terminals 30 and the back surface of the first conductive layer 63 that is exposed from the inside of the first base opening portion 71.

According to this method, over-etching of the light emitting-side terminals 17 is capable of being prevented, so that a reduction in the connection reliability of the light emitting-side terminals 17 is capable of being prevented.

According to this method, (9) the electrolytic plating layer 69 is provided on the surfaces of the light emitting-side terminals 17 from which the first electroless plating layer 64 is removed, the surfaces of the slider-side terminals 16 and the rear-side terminals 30 from which the second electroless plating layer 67 is removed, and the back surface of the first conductive layer 63 that is exposed from the inside of the first base opening portion 71 by electrolytic plating that supplies electricity from the metal supporting board 3, so that the electrolytic plating layer 69 is capable of being provided on the surfaces of the light emitting-side terminals 17 from which the first electroless plating layer 64 is removed, the surfaces of the slider-side terminals 16 and the rear-side terminals 30 from which the second electroless plating layer 67 is removed, and the lower surface of the first conductive layer 63 that is exposed from the inside of the first base opening portion 71 to be protected without separately providing a plating lead.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A method for producing a suspension board with circuit comprising the steps of:

(1) providing a first insulating layer on a metal supporting board so as to provide a first opening portion and a second opening portion penetrating in a thickness direction of the first insulating layer, (2) providing a first conductive layer including a first terminal on the first insulating layer so as to fill the inside of the first opening portion, (3) providing a first electroless plating layer on the surface of the first conductive layer by electroless plating, (4) providing a second insulating layer on the first insulating layer so as to provide a third opening portion penetrating in the thickness direction of the second insulating layer and exposing the first electroless plating layer and also forming the third opening portion so as to expose a part of the first electroless plating layer provided on the surface of the first conductive layer, (5) providing a second conductive layer including a second terminal on the second insulating layer so as to fill the inside of the third opening portion or on the second insulating layer and the first insulating layer so as to fill the second opening portion and the third opening portion, (6) providing a second electroless plating layer on the surface of the second conductive layer by electroless plating, (7) removing the first electroless plating layer corresponding to the first terminal and/or the second electroless plating layer corresponding to the second terminal by etching, (8) removing the metal supporting board in contact with the lower surface of the first conductive layer filling the inside of the first opening portion, and (9) providing an electrolytic plating layer on the surface of the first terminal with the first electroless plating layer removed and/or the surface of the second terminal with the second electroless plating layer removed and the lower surface of the first conductive layer exposed from the inside of the first opening portion by electrolytic plating supplying electricity from the metal supporting board.

2. The method for producing a suspension board with circuit according to claim 1, wherein (4) in the step of forming the second insulating layer, a fourth opening portion is formed in the second insulating layer so as to communicate with the second opening portion and (5) in the step of providing the second conductive layer, the second conductive layer is provided on the second insulating layer so as to fill the inside of the second opening portion, the third opening portion, and the fourth opening portion.

3. The method for producing a suspension board with circuit according to claim 2 further comprising:

(10) a step of insulating the metal supporting board in contact with the lower surface of the second conductive layer filling the inside of the second opening portion from the surrounding metal supporting.

4. The method for producing a suspension board with circuit according to claim 1, wherein (4) in the step of providing the second insulating layer, the third opening portion is, when projected in the thickness direction, formed so as to be disposed at the same position as that of the first opening portion.

5. The method for producing a suspension board with circuit according to claim 1, wherein (4) in the step of providing the second insulating layer, the third opening portion is, when projected in the thickness direction, formed so as to be disposed at a position different from that of the first opening portion.

6. The method for producing a suspension board with circuit according to claim 1, wherein the metal supporting board is disposed along a longitudinal direction;

(1) in the step of providing the first insulating layer, a plurality of the first opening portions are provided; and (8) in the step of removing the metal supporting board in contact with the lower surface of the first conductive layer filling the inside of the first opening portion, the metal supporting board in contact with the lower surface of the first conductive layer filling the inside of the first opening portion is removed so that a plurality of support opening portions penetrating in the thickness direction are provided and a plurality of the support opening portions are symmetrically disposed with respect to a reference line along the longitudinal direction.

7. The method for producing a suspension board with circuit according to claim 1, wherein the metal supporting board is made of stainless steel and the first electroless plating layer and/or the second electroless plating layer are/is formed of nickel.

* * * * *